US012586650B2

(12) United States Patent
Cho et al.

(10) Patent No.: US 12,586,650 B2
(45) Date of Patent: Mar. 24, 2026

(54) PAGE BUFFER CIRCUIT AND MEMORY DEVICE INCLUDING THE SAME

(71) Applicant: Samsung Electronics Co., Ltd., Suwon-si (KR)

(72) Inventors: Yongsung Cho, Suwon-si (KR); Insu Kim, Suwon-si (KR); Daeseok Byeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 282 days.

(21) Appl. No.: 18/367,799

(22) Filed: Sep. 13, 2023

(65) Prior Publication Data

US 2024/0145013 A1 May 2, 2024

(30) Foreign Application Priority Data

Nov. 2, 2022 (KR) ........................ 10-2022-0144623

(51) Int. Cl.
| | |
|---|---|
| *G11C 16/24* | (2006.01) |
| *G11C 16/04* | (2006.01) |
| *G11C 16/08* | (2006.01) |
| *G11C 16/10* | (2006.01) |
| *G11C 16/30* | (2006.01) |
| *G11C 16/34* | (2006.01) |
| *G11C 16/26* | (2006.01) |
| *G11C 16/32* | (2006.01) |

(52) U.S. Cl.
CPC .......... *G11C 16/24* (2013.01); *G11C 16/0483* (2013.01); *G11C 16/08* (2013.01); *G11C 16/10* (2013.01); *G11C 16/30* (2013.01); *G11C 16/3459* (2013.01); *G11C 16/26* (2013.01); *G11C 16/32* (2013.01)

(58) Field of Classification Search
CPC ..... G11C 16/24; G11C 16/0483; G11C 16/08; G11C 16/10; G11C 16/30; G11C 16/3459; G11C 16/32; G11C 11/5642; G11C 16/26; G11C 2211/5642; G11C 2211/5643; G11C 11/5628
See application file for complete search history.

(56) References Cited

U.S. PATENT DOCUMENTS

| | | | |
|---|---|---|---|
| 7,016,230 B2 | 3/2006 | Hosono | |
| 9,129,696 B2* | 9/2015 | Joo ..................... | G11C 11/5642 |

(Continued)

*Primary Examiner* — Amir Zarabian
*Assistant Examiner* — Justin Bryce Heisterkamp
(74) *Attorney, Agent, or Firm* — Muir Patent Law, PLLC

(57) ABSTRACT

A memory device includes a memory cell array, and a page buffer circuit including a plurality of page buffers selectively connected to memory cells via a plurality of bit lines, each of the plurality of page buffers including a sensing node. The sensing nodes may be charged to different levels during verification of programming states of the memory cells. For example, a first sensing node of a first page buffer connected to a first memory cell targeted for programming to a first program state from among the plurality of page buffers is precharged to a first level in a first precharge period during verification of the first program state. A second sensing node of a second page buffer connected to a second memory cell targeted for programming to a second program state charged to a second level during verification of the second program state, wherein the second level is different from the first level.

20 Claims, 20 Drawing Sheets

(56) References Cited

U.S. PATENT DOCUMENTS

| | | | | |
|---|---|---|---|---|
| 9,424,942 | B2 | 8/2016 | Shim | |
| 10,290,343 | B2 | 5/2019 | Kim et al. | |
| 10,395,727 | B2 * | 8/2019 | Yu | G11C 16/32 |
| 10,741,252 | B2 | 8/2020 | Lee | |
| 11,114,168 | B2 * | 9/2021 | Liang | G11C 16/30 |
| 11,315,641 | B1 * | 4/2022 | Xu | G11C 16/12 |
| 12,057,173 | B2 * | 8/2024 | Cho | G11C 11/5642 |
| 2005/0078524 | A1 * | 4/2005 | Hosono | G11C 16/26 |
| | | | | 365/185.17 |
| 2018/0096718 | A1 * | 4/2018 | Kim | G11C 5/145 |
| 2020/0357476 | A1 * | 11/2020 | Kim | G11C 16/3459 |
| 2021/0005265 | A1 * | 1/2021 | Lee | G11C 16/3468 |
| 2022/0044734 | A1 * | 2/2022 | Choi | G11C 16/24 |
| 2022/0208278 | A1 * | 6/2022 | Vu | G11C 16/0483 |
| 2022/0301634 | A1 * | 9/2022 | Kamata | G11C 16/26 |
| 2023/0326532 | A1 * | 10/2023 | Shikata | G11C 16/26 |
| 2023/0352098 | A1 * | 11/2023 | Ganesh Rao | G11C 16/3427 |
| 2024/0071507 | A1 * | 2/2024 | Kawai | G11C 16/3459 |
| 2024/0153565 | A1 * | 5/2024 | Cho | G11C 16/26 |

* cited by examiner

PAGE BUFFER CIRCUIT AND MEMORY DEVICE INCLUDING THE SAME

CROSS-REFERENCE TO RELATED APPLICATION

This application is based on and claims priority under 35 U.S.C. § 119 to Korean Patent Application No. 10-2022-0144623, filed on Nov. 2, 2022, in the Korean Intellectual Property Office, the disclosure of which is incorporated by reference herein in its entirety.

BACKGROUND

The inventive concept relates to a memory device, and more particularly, to a page buffer circuit and a memory device including the same.

As information communication devices have recently become multifunctional, memory devices are required to have larger capacity and higher integrity. A memory device may include a page buffer circuit for storing data in memory cells or outputting data from the memory cells. For example, a page buffer circuit may include a plurality of page buffers located to correspond to a plurality of bit lines, and each of the page buffers may include semiconductor devices such as transistors.

In a program verification operation of a memory device, verification voltages of various levels may be applied to a word line to verify a plurality of program states of memory cells. There is a problem in that the time required to change a level of a verification voltage applied to a word line occupies a large proportion of the total time required for a program operation.

SUMMARY

The inventive concept relates to a page buffer circuit in which a plurality of program states are verified while a level of a verification voltage is maintained. According to an aspect of the inventive concept, there is provided a memory device including a memory cell array comprising a plurality of memory cells respectively connected to a plurality of word lines; a page buffer circuit connected to the memory cell array through a plurality of bit lines, including a first bit line and a second bit line, and comprising a plurality of page buffers each connected to a corresponding one of the plurality of bit lines, each of the plurality of page buffers comprising a corresponding sensing node, the page buffers including a first page buffer connected to a first memory cell via the first bit line and a second page buffer connected to a second memory cell via the second bit line; a page buffer circuit configured to: precharge a first sensing node of the first page buffer connected to the first memory cell to a first level in a first precharge period during verification of a first program state of the first memory cell, and precharge a second sensing node of the second page buffer connected to the second memory cell to a second level in a second precharge period during verification of a second program state of the second memory cell, wherein the second level is different from the first level; and a row decoder configured to apply a verify voltage to a word line commonly connected to the first memory cell and the second memory cell during the first precharge period and the second precharge period, wherein a level of the verify voltage applied to the word line during the first precharge period and the second precharge period are same.

2

According to another aspect of the inventive concept, there is provided a memory device including a memory cell array comprising a plurality of memory cells; a page buffer circuit connected to the memory cell array through a plurality of bit lines and comprising a plurality of page buffers each connected to a corresponding one of the plurality of bit lines, each of the plurality of page buffers comprising a boost node, a sensing node and a precharge circuit configured to precharge the sensing node to a first level during verification of a first program state and during verification of a second program state; and a boost voltage controller configured to apply to boost nodes of page buffers of memory cells selected for verification of the second program state, a boost voltage during verification of the second program state to increase the voltage level of sensing nodes of the page buffers from the first level to a second level higher than the first level, and to not apply any boost voltage to boost nodes of the page buffers during verification of the first program state.

According to another aspect of the inventive concept, there is provided a page buffer circuit comprising a plurality of page buffers respectively corresponding to a plurality of bit lines, wherein each of the plurality of page buffers comprises: a sensing node formed in a first wiring layer selectively connected to a precharge circuit to be precharged to a first level during a verification operation, selectively connected to a corresponding bit line to be developed in a developing period, and selectively connected to a sensing latch to provide a voltage level of the sensing node in a sensing period to be compared with a reference voltage level; and a boost node formed in the first wiring layer configured to boost a voltage level of the sensing node when a boost voltage is applied during the verification operation, wherein a wiring corresponding to the sensing node and a wiring corresponding to the boost node are located adjacent to each other in the first wiring layer and are capacitively coupled together.

BRIEF DESCRIPTION OF THE DRAWINGS

Embodiments will be more clearly understood from the following detailed description taken in conjunction with the accompanying drawings in which:

FIG. 7 is a detailed view illustrating a page buffer, according to an embodiment;

FIG. 11 is a timing diagram for describing a verification operation, according to an embodiment;

FIG. 12 is a diagram for describing a program loop, according to an embodiment;

FIG. 14 is a diagram for describing a program loop, according to an embodiment;

DETAILED DESCRIPTION OF THE EMBODIMENTS

Hereinafter, various embodiments will be described with reference to the accompanying drawings.

Figure 1:
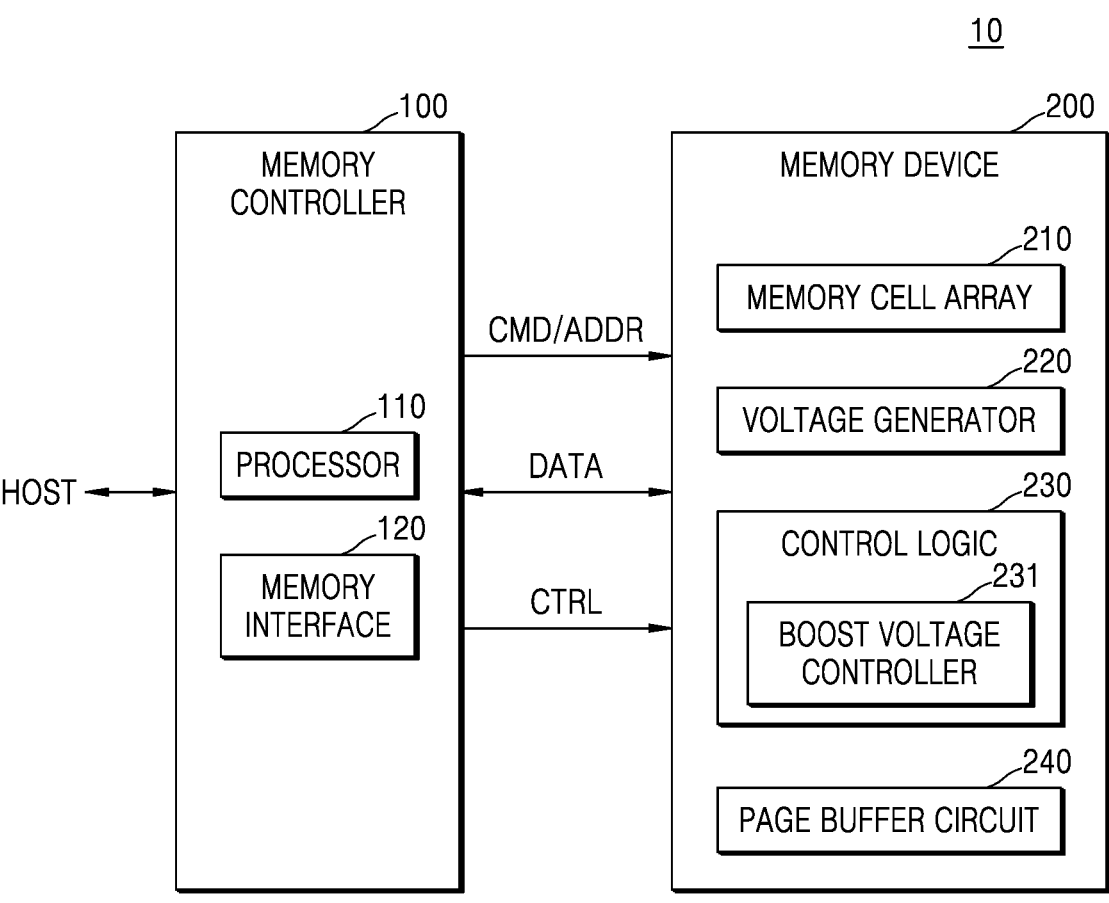
FIG. 1 is a block diagram illustrating a memory system, according to an embodiment.

FIG. 1 is a block diagram illustrating a memory system, according to an embodiment.

Referring to FIG. 1, a memory system 10 may include a memory controller 100 and a memory device 200. The memory device 200 may be a semiconductor chip forming an integrated circuit, and may include various circuits therein, including a memory cell array 210, a voltage generator 220, control logic 230, and a page buffer circuit 240. The control logic 230 may include a boost voltage controller 231 (a circuit of the control logic 230). Although the boost voltage controller 231 is provided in the control logic 230 in the example of FIG. 1, the boost voltage controller 231 may be implemented as a separate circuit outside the control logic 230.

For example, the memory system 10 may communicate with a host through various interfaces. For example, the memory system 10 may communicate with the host through any of various interfaces such as universal serial bus (USB), multimedia card (MMC), embedded MMC (eMMC), peripheral component interconnection (PCI), PCI-express (PCI-E), advanced technology attachment (ATA), serial-ATA, parallel-ATA, small computer small interface (SCSI), enhanced small disk interface (ESDI), integrated drive electronics (IDE), firewire, universal flash storage (UFS), or nonvolatile memory express (NVMe).

In an embodiment, the memory device 200 may be a nonvolatile memory device. In some embodiments, the memory system 10 may be embedded in an electronic device, or may be implemented as a removable memory. For example, the memory system 10 may be implemented as any of various types of devices such as an embedded universal flash storage (UFS) memory device, an embedded multi-media card (eMMC), a solid state drive (SSD), a UFS memory card, a compact flash (CF) card, a secure digital (SD) card, a micro secure digital (micro-SD) card, a mini secure digital (mini-SD) card, an extreme digital (xD) card, or a memory stick. Also, the memory system 10 may be referred to as a storage device that stores data in a nonvolatile manner.

The memory controller 100 may control the memory device 200 to read data stored in the memory device 200 or write data to the memory device 200 in response to a write/read request from a host HOST. For example, the memory controller 100 may include a processor 110 and a memory interface 120, and the processor 110 may control an overall operation in the memory controller 100 and may control a memory operation of the memory device 200. In detail, the memory controller 100 may control write, read, and erase operations of the memory device 200, by applying an address ADDR, a command CMD, and a control signal CTRL through the memory interface 120. Also, data DATA to be stored in the memory device 200 and data DATA read from the memory device 200 may be transmitted and received between the memory controller 100 and the memory device 200.

The memory cell array 210 may include a plurality of memory cells. For example, the plurality of memory cells may be flash memory cells. Hereinafter, embodiments will be described assuming that the plurality of memory cells are NAND flash memory cells. However, the inventive concept is not limited thereto, and in some embodiments, the plurality of memory cells may be resistive memory cells such as resistive RAM (ReRAM), phase-change RAM (PRAM), or magnetic RAM (MRAM).

In an embodiment, the memory cell array 210 may include a three-dimensional memory cell array, the three-dimensional memory cell array may include a plurality of cell strings, and each cell string may include memory cells respectively connected to word lines that are vertically stacked on a substrate. However, the inventive concept is not limited thereto, and in some embodiments, the memory cell array 210 may include a two-dimensional memory cell array, and the two-dimensional memory cell array may include a plurality of cell strings arranged in rows and columns.

The voltage generator 220 may generate various voltages in the memory device 200. For example, the voltage generator 220 may generate a program voltage for a program operation and a verification voltage for a verification operation. Also, the voltage generator 220 may variously adjust levels of the program voltage and the verification voltage under the control of the control logic 230. For example, the voltage generator 220 may apply verification voltages having various levels to verify a plurality of threshold voltage distributions of the memory cells (e.g., of memory cell transistors of NAND flash memory cells).

The control logic 230 may control an overall operation of the memory device 200. For example, the control logic 230 may output various internal control signals for programming data to the memory cell array 210 or reading data from the memory cell array 210 based on the command CMD, the address ADDR, and the control signal CTRL received from the memory controller 100. Also, the control logic 230 may output a voltage control signal (not shown) for adjusting levels of various voltages output from the voltage generator 220 in relation to program, read, verification, and erase operations.

The page buffer circuit 240 may include a plurality of page buffers PB connected to corresponding ones of a plurality of bit lines. In an example, each page buffer PB may include a sensing node, and may be connected to memory cells through a corresponding bit line. During a verification operation, each page buffer PB may monitor current flowing through the sensing node to determine a logic state of data stored in the memory cell of a selected word line (e.g., by determining whether the memory cell is an on-cell or an off-cell). Each page buffer PB may determine a logic state of data stored in the memory cell to verify whether the memory cell is programmed to a target program state.

According to an embodiment, in order to control boost and/or boost-down of the sensing node, the page buffer PB may further include a boost node implemented as a metal wiring.

The boost voltage controller 231 may further output a boost voltage control signal for adjusting a level of a voltage (e.g., a boost voltage) applied to the boost node. For example, the voltage generator 220 may increase or reduce a level of a boost voltage applied to the boost node based on the boost voltage control signal. During some of the verification operations, the boost voltage controller 231 may provide a control signal (not shown) to apply the boost voltage provided by the voltage generator 220 to the boost node BN of each page buffer PB after the sensing node SO has been precharged to increase the voltage level of the sensing node. For example, wiring may connect each of the boost nodes BN of the page buffers PB to an output node of the voltage generator 220 to apply the boost voltage provided by the voltage generator 220 to the boost node BN. One or more switches (e.g., one or more transistors) (not shown) may be provided with the wiring to selectively connect the output of the voltage generator 220 to the boost nodes BN, the switch(es) being switched on by the control signal provided by the boost voltage controller 231 to connect the boost node BN of each page buffer PB the output of the voltage generator 220. Further details and examples are described below.

During a verification operation, a verification voltage may be applied to a word line through the voltage generator 220. During the verification operation, the page buffer circuit 240 may determine whether memory cells connected to the word line are on-cells or off-cells, based on a precharge period for precharging the sensing node, a developing period for developing the sensing node, and a sensing period for sensing a voltage level of the sensing node.

According to an embodiment, boosting the sensing node allows the memory device 200 may verify a plurality of program states while maintaining a level of a verification voltage applied to the word line. In detail, the memory device 200 may verify a relatively high program state by precharging the sensing node without boosting the sensing node, and may verify a relatively low program state by precharging the sensing node and then boosting the sensing node to a higher voltage level.

During operation, it may take a lot of time to change a level of a verification voltage applied to a word line to verify program states. According to the inventive concept, because a plurality of program states may be verified while a level of a verification voltage applied to a word line is maintained (i.e., the level of the verification voltage is the same and not changed), the time required to perform a verification operation may be reduced. Accordingly, the memory device 200 may provide a high program speed.

Figure 2:
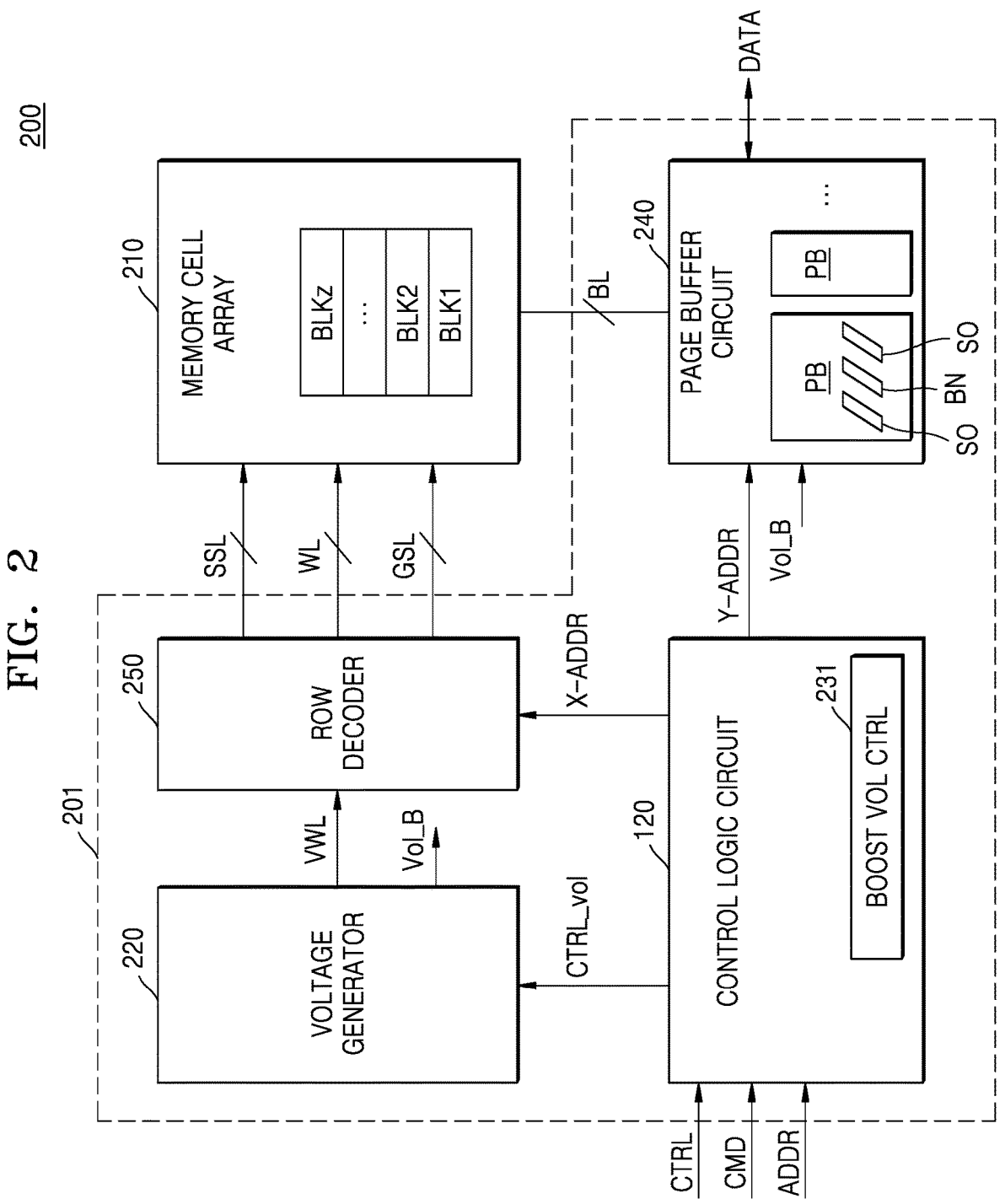
FIG. 2 is a block diagram illustrating an example of a memory device of FIG. 1.

FIG. 2 is a block diagram illustrating an example of a memory device of FIG. 1.

Referring to FIG. 2, the memory device 200 may include the memory cell array 210 and a peripheral circuit 201. The peripheral circuit 201 may include the voltage generator 220, the control logic 230, the page buffer circuit 240, and a row decoder 250. Although not shown in FIG. 2, the peripheral circuit 201 may further include various other circuits related to a memory operation such as column logic (e.g., a column decoder), a pre-decoder, a temperature sensor, a command decoder, a block address decoder, and an input/output interface.

The memory cell array 210 may be connected to the page buffer circuit 240 through bit lines BL, and may be connected to the row decoder 250 through word lines WL, string selection lines SSL, and ground selection lines GSL. The memory cell array 210 may include a plurality of memory cells. For example, the memory cells may be flash memory cells. Hereinafter, embodiments will be described assuming that the plurality of memory cells are NAND flash memories. However, the inventive concept is not limited thereto, and in some embodiments, the plurality of memory cells may be resistive memory cells such as resistive RAM (ReRAM), phase-change RAM (PRAM), ferroelectric RAM (FRAM), or magnetic RAM (MRAM).

In an embodiment, the memory cell array 210 may include three-dimensional cell array, the three-dimensional cell array may include a plurality of cell strings, and each cell string may include memory cells respectively connected to word lines that are vertically stacked on a substrate.

The control logic 230 may output various control signals, for example, a voltage control signal CTRL_vol, a row address X-ADDR, and a column address Y-ADDR, for writing or programing data to the memory cell array 210, verifying the programmed data, reading data from the memory cell array 210, or erasing data stored in the memory cell array 210, based on a command CMD, an address ADDR, and a control signal CTRL. Accordingly, the control logic 230 may generally control various operations in the memory device 200.

The voltage generator 220 may generate various types of voltages to perform program, read, and erase operations on the memory cell array 210 based on the voltage control signal CTRL_vol. In detail, the voltage generator 220 may generate a word line voltage (a voltage applied to a word line), which may be, for example, a program voltage, a read voltage, a pass voltage, an erase verification voltage, or a program verification voltage. Also, the voltage generator 220 may further generate a string selection line voltage and a ground selection line voltage based on the voltage control signal CTRL_vol. Also, the voltage generator 220 may generate one or more voltages for driving or controlling the page buffer circuit 240. According to embodiments, the voltage generator 220 may adjust and output a level of a voltage (e.g., a boost voltage Vol_B) applied to a boost node BN located in each page buffer PB of the page buffer circuit 240 under the control of the boost voltage controller 231.

The row decoder 250 may perform a selection operation on the plurality of word lines WL and a selection operation on the plurality of string selection lines SSL, in response to the row address X-ADDR. A word line that is identified by a row address, such as to read or write to memory cells connected to that word line, may be considered a selected word line and other word lines (e.g., in the same block as the elected word line), may be considered as unselected. Also, the page buffer circuit 240 may select at least one of the bit lines BL in response to the column address Y-ADDR. Each page buffer PB of the page buffer circuit 240 may operate as a write driver or a sense amplifier according to an operation mode (e.g., according to whether a write operation or a read operation is being performed).

The page buffer circuit 240 may include a plurality of page buffers PB connected to corresponding ones of the plurality of bit lines BL. Each of the page buffers PB may be connected to a corresponding bit line BL from among the plurality of bit lines BL. The page buffer circuit 240 may temporarily store data read from the memory cell array 210 or may temporarily store data to be written to the memory cell array 210. For example, each of the page buffers PB may include one or more latches. Each latch may temporarily store data.

According to an embodiment, each page buffer PB may include the boost node BN and a sensing node SO implemented through a metal wiring which may be formed from one or more of a plurality of metal layers of the memory device 200.

The wiring corresponding to the boost node BN may be located between wirings forming the sensing nodes SO. The wiring corresponding to the boost node BN and the wiring corresponding to the sensing node SO may be spaced apart from each other to form a capacitor, creating a capacitance between the boost node BN and the sensing node SO forming opposing conductors of the capacitor.

Although not shown in FIG. 2, the wiring corresponding to the sensing node SO may be surrounded by the wiring corresponding to the boost node BN and a wiring that supplies power. That is, in order to prevent the sensing node SO (used to determine an on-cell and an off-cell) from being exposed to noise, a power supply wiring or the boost node BN to which a relatively constant signal is applied may be located adjacent to the wiring corresponding to the sensing node SO, rather than other internal wiring where voltage transitions frequently occur.

Figure 3:
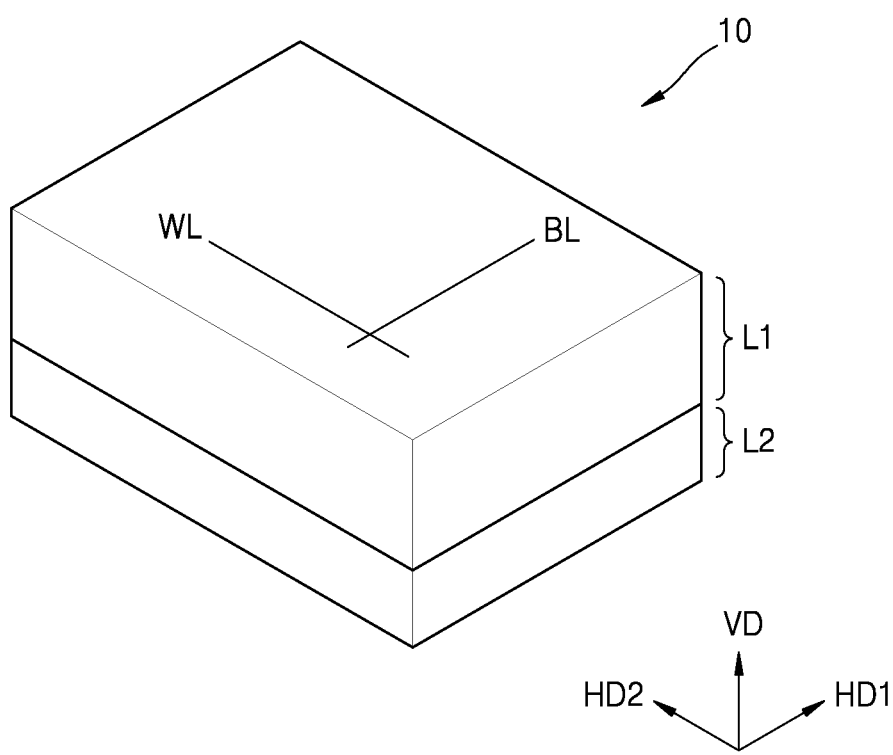
FIG. 3 is a view schematically illustrating a structure of the memory device of FIG. 1, according to an embodiment.
Figure 4:
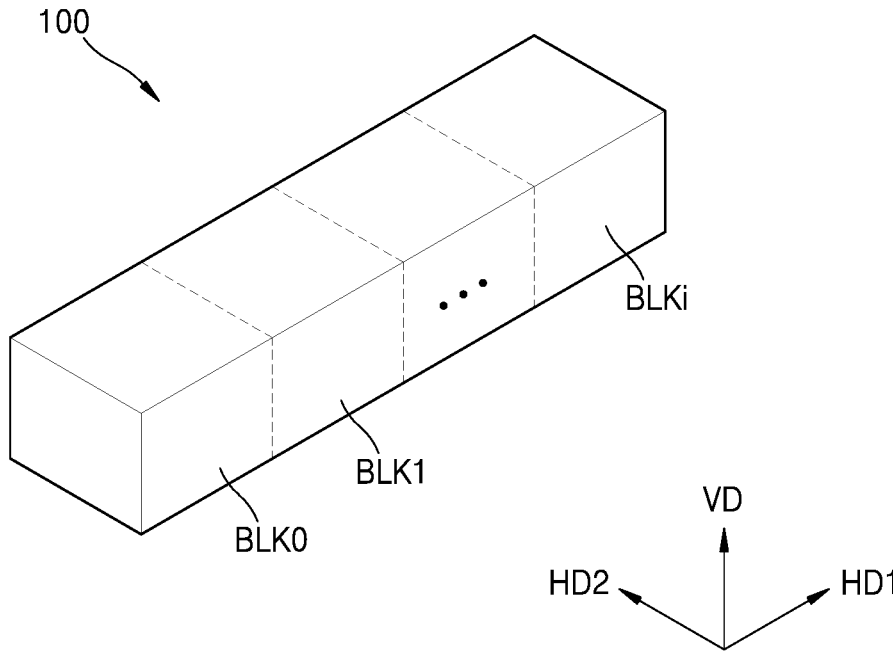
FIG. 4 is a view illustrating an example of a memory cell array of FIG. 1.
Figure 5:
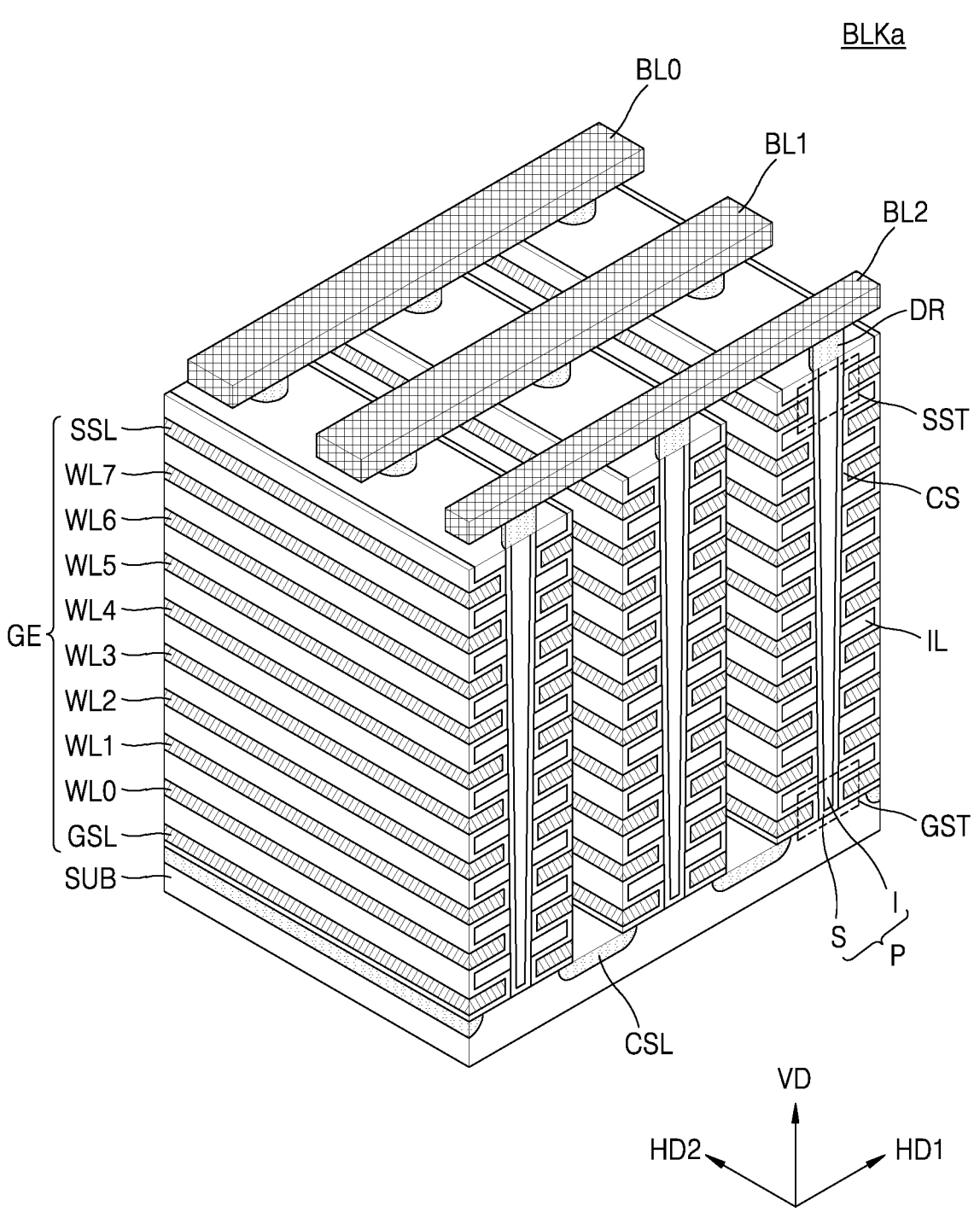
FIG. 5 is a perspective view illustrating an example of a structure of a memory block of FIG. 4.

FIG. 3 is a view schematically illustrating a structure of a memory device of FIG. 1, according to an embodiment. FIG. 4 is a view illustrating an example of a memory cell array of FIG. 1. FIG. 5 is a perspective view illustrating an example of a structure of a memory block of FIG. 4. Although a cell over periphery (COP) structure is illustrated in the example of the memory device 200 in FIG. 3, embodiments are not limited thereto, and the memory device 200 may be implemented to have various other structures.

Referring to FIG. 3, the memory device 200 may include a first semiconductor layer L1 and a second semiconductor layer L2, and the first semiconductor layer L1 may be stacked on the second semiconductor layer L2 in a vertical direction VD. In detail, the second semiconductor layer L2 may be located under the first semiconductor layer L1 in the vertical direction VD, and thus, the second semiconductor layer L2 may be located close to a substrate of the first semiconductor layer L1.

In an embodiment, the memory cell array 210 of FIG. 1 may be formed in the first semiconductor layer L1, and the peripheral circuit 201 of FIG. 1 may be formed in the second semiconductor layer L2. Accordingly, the memory device 200 may have a structure, that is, a COP structure, in which the memory cell array 210 is located over the peripheral circuit 201. The COP structure may effectively reduce a horizontal area, and may increase a degree of integration of the memory device 200.

In an embodiment, the second semiconductor layer L2 may include a substrate, and transistors and metal patterns for wiring the transistors may be formed on the substrate to form the peripheral circuit 201 in the second semiconductor layer L2. In some examples, each of the first and second semiconductor layers L1 and L2 may be formed on a corresponding crystalline semiconductor substrate. After the peripheral circuit 201 is formed in the second semiconductor layer L2, the first semiconductor layer L1 including the memory cell array 210 may be formed, and metal patterns for electrically connecting the word lines WL and the bit lines BL of the memory cell array 210 to the peripheral circuit 201 formed in the second semiconductor layer L2 may be formed. For example, the bit lines BL may extend in a first horizontal direction HD1, and the word lines WL may extend in a second horizontal direction HD2.

Referring to FIG. 4, the memory cell array 210 may include a plurality of memory blocks BLK0 to BLKi, and i may be a positive integer. Each of the plurality of memory blocks BLK0 to BLKi may have a three-dimensional structure (or a vertical structure). In detail, each of the plurality of memory blocks BLK0 to BLKi may include a plurality of NAND strings extending in the vertical direction VD. In this case, the plurality of NAND strings may be spaced apart from each other by a specific distance in the first and second horizontal directions HD1 and HD2. The plurality of memory blocks BLK0 to BLKi may be selected by the row decoder 250 (see FIG. 1). For example, the row decoder 250 may select a memory block corresponding to a block address from among the plurality of memory blocks BLK0 to BLKi. Memory cells of each block may be erased in together in the same erase operation. The block BLK may form the minimal unit of erasure of the memory device 200.

Referring to FIG. 5, a memory block BLKa may be formed in a direction perpendicular to a substrate SUB. The substrate SUB includes a common source line CSL that has a first conductivity type (e.g., p-type), extends in the second horizontal direction HD2 on the substrate SUB, and is doped with impurities of a second conductivity type (e.g., n-type). A plurality of insulating layers IL extending in the second horizontal direction HD2 are sequentially provided in the vertical direction VD on an area of the substrate SUB between two adjacent common source lines CSL, and the plurality of insulating layers IL are spaced apart from each other by a specific distance in the vertical direction VD. For example, the plurality of insulating layers IL may be formed of an insulating material such as silicon oxide.

A plurality of pillars P sequentially arranged in the first horizontal direction HD1 and passing through the plurality of insulating layers IL in the vertical direction VD are provided on an area of the substrate SUB between two adjacent common source lines CSL. For example, the plurality of pillars P may pass through the plurality of insulating layers IL to contact the substrate SUB. In detail, a surface layer S of each pillar P may be formed of a first type of semiconductor (e.g., silicon) material, and may provide channel regions of a plurality of memory cell transistors of the NAND string formed by each pillar P. An inner layer I of each pillar P may include an insulating material such as silicon oxide or an air gap.

A charge storage layer CS is provided along exposed surfaces of the insulating layers IL, the pillars P, and the substrate SUB, in an area between two adjacent common source lines CLS. The charge storage layer CS may include a gate insulating layer (or referred to as a 'tunneling insulating layer'), a charge trapping layer, and a blocking insulating layer. For example, the charge storage layer CS may have an oxide-nitride-oxide (ONO) structure. Also, gate electrodes GE, such as a ground selection line GSL, a string selection line SSL and word lines WL0 to WL7, are provided adjacent the pillars and have charge storage layer CS interposed therebetween.

Drains or drain contacts DR are respectively provided on the plurality of pillars P. For example, the drains or the drain contacts DR may include a silicon material doped with impurities having the second conductivity type. Bit lines BL0 to BL2 extending in the first horizontal direction HD1 and spaced apart from each other by a specific distance in the second horizontal direction HD2 are provided on the drains DR.

Figure 6:
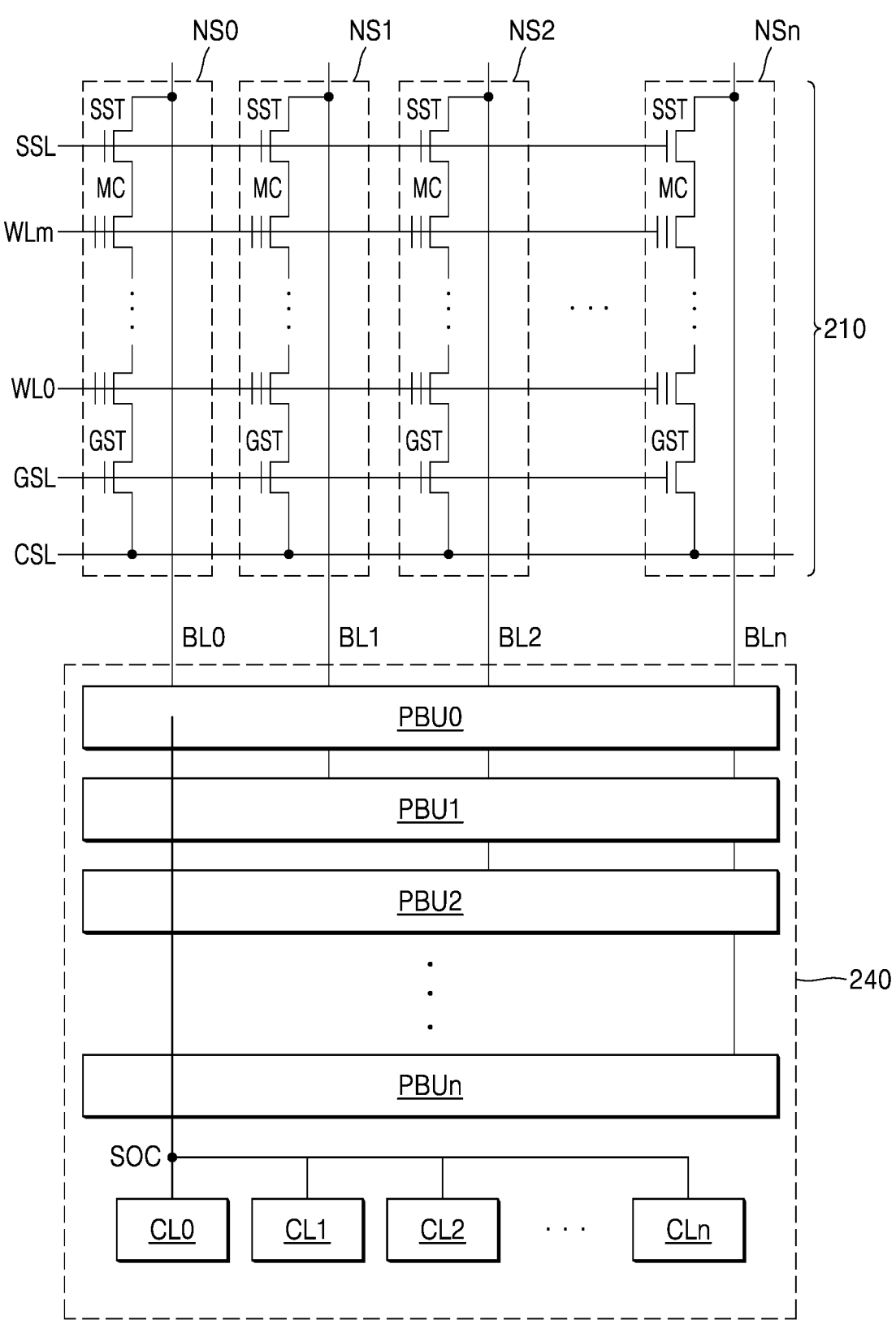
FIG. 6 is a diagram illustrating an example of connection between a memory cell array and a page buffer circuit, according to an embodiment.

FIG. 6 is a diagram illustrating an example of connection between the memory cell array 210 and the page buffer circuit 240, according to an embodiment.

Referring to FIG. 6, the memory cell array 210 may include first to n+1$^{th}$ NAND strings NS0 to NSn, and each of the first to n+1$^{th}$ NAND strings NS0 to NSn may include a ground selection transistor GST connected to the ground selection line GSL, a plurality of memory cells MC (e.g., memory cell transistors) respectively connected to a plurality of word lines WL0 to WLm, and a string selection transistor SST connected to the string selection line SSL, and the ground selection transistor GST, the plurality of memory cells MC, and the string selection transistor SST may be connected to each other in series. Here, m is a positive integer.

The page buffer circuit 240 may include first to n+1$^{th}$ page buffer units PBU0 to PBUn. The first page buffer unit PBU0 may be connected to the first NAND string NS0 through a first bit line BL0, and the n+1$^{th}$ page buffer unit PBUn may be connected to the n+1$^{th}$ NAND string NSn through an n+1$^{th}$ bit line BLn. Here, n is a positive integer. For example, n may be 7, and the page buffer circuit 240 may have a structure in which eight-step page buffer units PBU0 to PBUn are aligned. For example, the first to n+1$^{th}$ page buffer units PBU0 to PBUn may be aligned in an extending direction of the first to n+1$^{th}$ bit lines BL0 to BLn.

The page buffer circuit 240 may further include first to n+1$^{th}$ cache latches CL0 to CLn respectively corresponding to the first to n+1$^{th}$ page buffer units PBU0 to PBUn. For example, n may be 7, and the page buffer circuit 240 may have a structure in which eight-step cache latches CL0 to CLn are aligned. For example, the first to n+1$^{th}$ cache latches CL0 to CLn may be aligned in the extending direction of the first to n+1$^{th}$ bit lines BL0 to BLn. One of the page buffer units PBU0 to PBUn and a corresponding cache latch may correspond to a page buffer PB of FIG. 2 (a plurality of page buffers PB forming page buffer circuit 240 of FIG. 2). The circuitry in the dashed box 240 shown in FIG. 6 may be repetitively provided for all of the bit lines BL of the memory cell array 210 such that all memory cells are connected to a page buffer PB (and page buffer unit PBU) via a corresponding bit line BL.

Sensing nodes of the first to n+1$^{th}$ page buffer units PBU0 to PBUn may be commonly connected to a combined sensing node SOC. Also, the first to n+1$^{th}$ cache latches CL0 to CLn may be commonly connected to the combined sensing node SOC. Accordingly, the first to n+1$^{1}$ page buffer units PBU0 to PBUn may be connected to the first to n+1$^{th}$ cache latches CL0 to CLn through the combined sensing node SOC.

Figure 7:
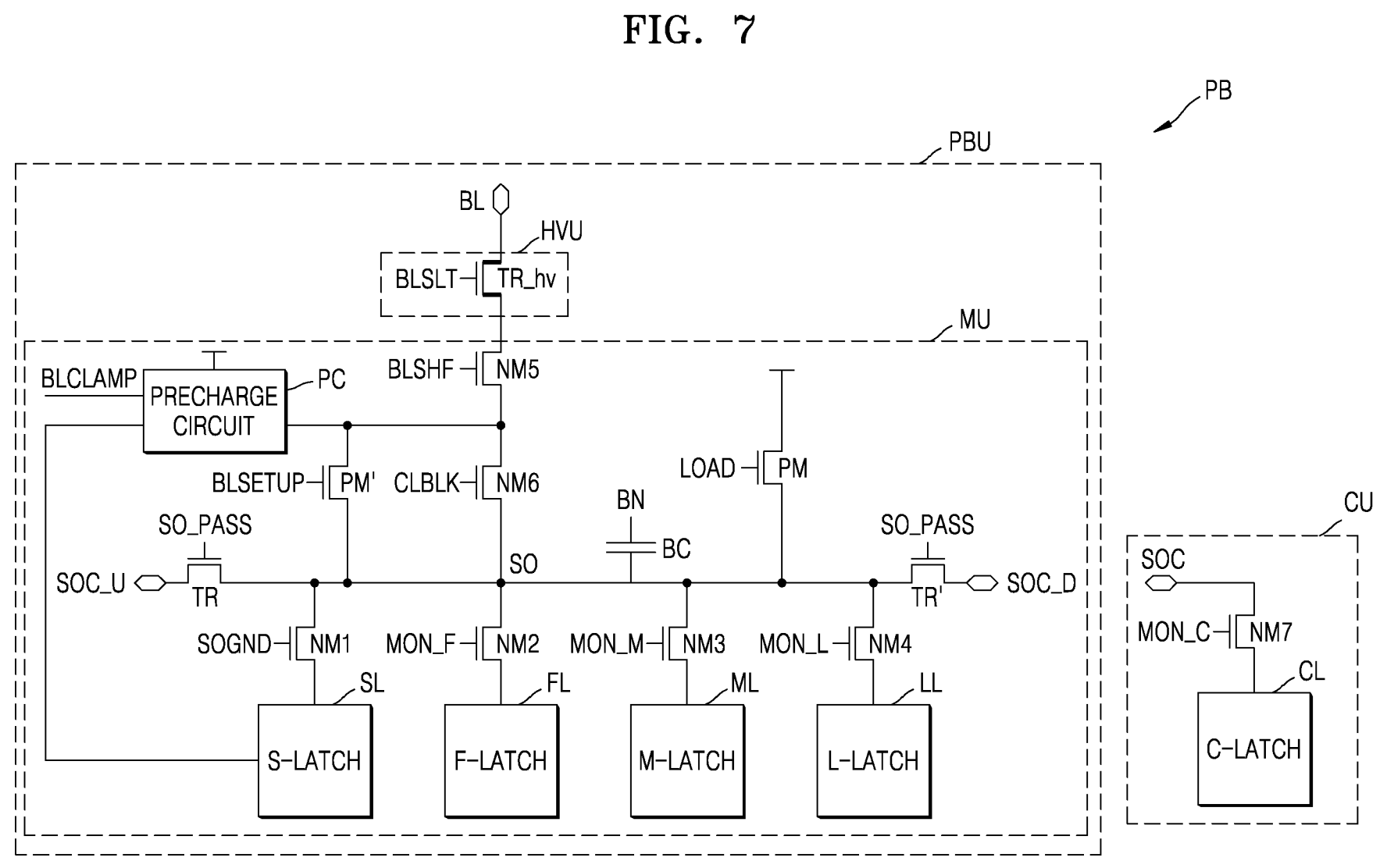

FIG. 7 is a detailed view illustrating the page buffer PB, according to an embodiment.

The page buffer PB of FIG. 7 may correspond to a page buffer PB of FIG. 2. The page buffer PB may include a page buffer unit PBU and a cache unit CU. The cache unit CU may include a cache latch C-LATCH CL, and because the cache latch CL is connected to a data input/output line, the cache unit CU may be located adjacent to the data input/output line. Accordingly, the page buffer unit PBU and the cache unit CU may be spaced apart from each other, and the page buffer PB may have a structure in which the page buffer unit PBU and the cache unit CU are separated from each other.

The page buffer unit PBU may include a main unit MU. The main unit MU may include main transistors in the page buffer PB. The page buffer unit PBU may further include a bit line selection transistor TR_hv connected to the bit line BL and driven by a bit line selection signal BLSLT. The bit line selection transistor TR_hv may be implemented as a high-voltage transistor, and thus, the bit line selection transistor TR_hv may be located in a well region different from the main unit MU, that is, a high-voltage unit HVU.

The main unit MU may include a sensing latch S-LATCH SL, a force latch F-LATCH FL, a higher bit latch M-LATCH ML, and a lower bit latch L-LATCH LL. According to an embodiment, the sensing latch SL, the force latch FL, the higher bit latch ML, or the lower latch LL may be referred to as a "main latch". The main unit MU may further include a precharge circuit PC that may control a precharge operation on the bit line BL or the sensing node SO based on a bit line clamping control signal BLCLAMP, and may further include a transistor PM' driven by a bit line setup signal BLSETUP. The transistor PM' may precharge the sensing node SO to a precharge level in a precharge period.

During a read or program verification operation, the sensing latch SL may store data stored in the memory cell or a sensing result of a threshold voltage of the memory cell, through a bit line connected to the memory cell. Also, during a program operation, the sensing latch SL may be used to apply a program bit line voltage or a program inhibition voltage to the bit line BL. The force latch FL may be used to improve threshold voltage distribution during a program operation. In detail, the force latch FL stores force data. The force data may be initially set to '1', and then may be inverted to '0' when a threshold voltage of a memory cell enters a forcing area that is less than a target area. During a program execution operation, by using the force data, a bit line voltage may be controlled and a relatively narrow program threshold voltage distribution may be formed.

The higher bit line ML, the lower bit latch LL, and the cache latch CL may be used to store data input from the outside during a program operation, and may be referred to as a "data latch". When 3-bit data is programmed to one memory cell, the 3-bit data may be stored in each of the higher bit latch ML, the lower bit latch LL, and the cache latch CL. Until programing of the memory cell is completed, the higher bit latch ML, the lower bit latch LL, and the cache latch CL may maintain the stored data. Also, during a read operation, the cache latch CL may receive data read from the memory cell from the sensing latch SL and may output the data to the outside through the data input/output line.

Also, the main unit MU may further include first to fourth transistors NM1 to NM4. The first transistor NM1 may be connected between the sensing node SO and the sensing latch SL, and may be driven by a ground control signal SOGND. The second transistor NM2 may be connected between the sensing node SO and the force latch FL, and may be driven by a forcing monitoring signal MON_F. The third transistor NM3 may be connected between the sensing node SO and the higher bit latch ML, and may be driven by a higher bit monitoring signal MON_M. The fourth transistor NM4 may be connected between the sensing node SO and the lower bit latch LL, and may be driven by a lower bit monitoring signal MON_L.

Also, the main unit MU may further include fifth and sixth transistors NM5 and NM6 connected in series between the bit line selection transistor TR_hv and the sensing node SO. The fifth transistor NM5 may be driven by a bit line shut-off signal BLSHF, and the sixth transistor NM6 may be driven by a bit line connection control signal CLBLK. Also, the main unit MU may further include a precharge transistor PM. The precharge transistor PM may be connected to the sensing node SO, may be driven by a load signal LOAD, and may precharge the sensing node SO to a precharge level in a precharge period.

In the present embodiment, the main unit MU may further include a pair of pass transistors, that is, first and second pass transistors TR and TR', connected to the sensing node SO. The first and second pass transistors TR and TR' may be driven according to first and second sensing node pass control signals SO_PASS and SO_PASS'. In some embodiments, the first sensing node pass control signal SO_PASS and the second sensing node pass control signal SO_PASS' may have different logic levels. The first pass transistor TR may be connected between a first terminal SOC_U and the sensing node SO, and the second pass transistor TR' may be connected between the sensing node SO and a second terminal SOC_D.

For example, when the page buffer unit PBU is the second page buffer unit PBU1 of FIG. 5, the first terminal SOC_U may be connected to one end of a pass transistor included in the first page buffer unit PBU0, and the second terminal SOC_D may be connected to one end of a pass transistor included in the third page buffer unit PBU3. Accordingly, the sensing node SO may be electrically connected to the combined sensing node SOC, through pass transistors respectively included in the third to $n+1^{th}$ page buffer units PBU2 to PBUn.

During a program operation, the page buffer PB verifies whether programing of a memory cell selected from among memory cells included in a NAND string connected to the bit line BL is completed. In detail, during a program verification operation, the page buffer PB stores data sensed through the bit line BL in the sensing latch SL. The higher bit latch ML and the lower bit latch LL in which target data is stored are set according to the sensed data stored in the sensing latch SL. For example, when the sensed data indicates that programming is completed, the higher bit latch ML and the lower bit latch LL are switched to a program inhibition setting for a selected memory cell in a subsequent program loop. The cache latch CL may temporarily store input data provided from the outside. During a program operation, target data stored in the cache latch CL may be stored in the higher bit latch ML and the lower bit latch LL.

Figure 8:
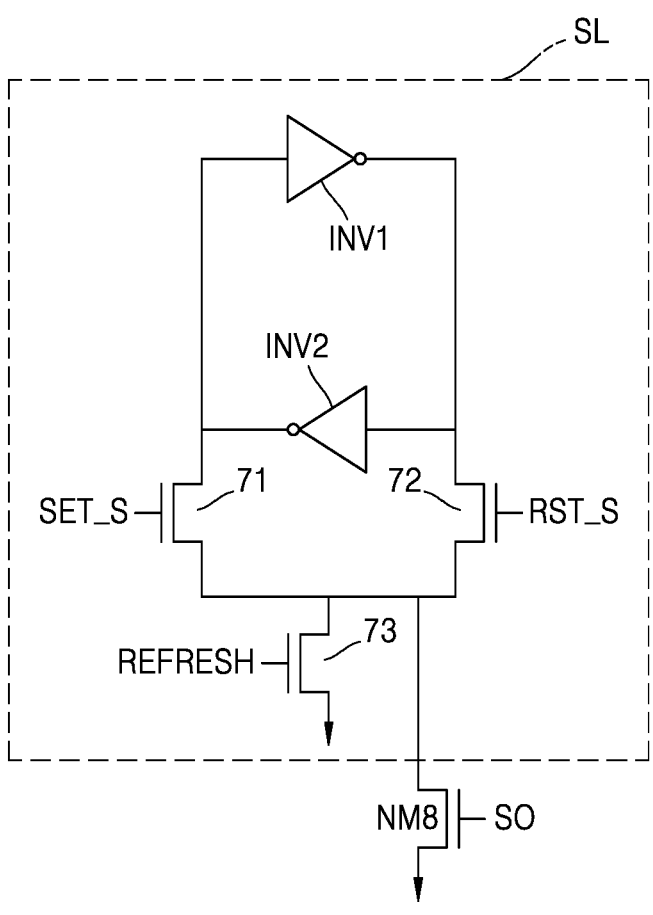
FIG. 8 is a circuit diagram illustrating a sensing latch, according to an embodiment.

The main unit MU may further include an eighth transistor NM8 connected to the sensing latch SL (see FIG. 8). The eighth transistor NM8 may provide a discharge path to the sensing latch SL according to a level of the sensing node SO. That is, when a level of the sensing node SO is higher than a threshold voltage level of the eighth transistor NM8, a discharge path may be provided to the sensing latch SL. In the specification, a threshold voltage of the eighth transistor NM8 may be referred to as a sensing trip.

Referring to FIG. 7, the sensing node SO may be connected to the boost node BN through a boost capacitor BC. While a verification voltage applied to a word line is maintained (or applied to the word line at the same level), the page buffer PB may be configured to verify a selected one of several different program states, such as configured to verify a higher program state or a lower program state. In detail, when verifying a higher program state, during a precharge period, the boost node BN may not be precharged and the sensing node SO may be precharged to the precharge voltage provided by the precharge circuit PC. When verifying a lower program state, during the precharge period, the sensing node SO is first precharged to the precharge voltage provided by the precharge circuit PC, and then the boost node BN has its voltage raised to boost the voltage level of the sensing node SO to a level higher than the precharge voltage.

FIG. 8 is a circuit diagram illustrating the sensing latch SL, according to an embodiment.

Referring to FIG. 8, the sensing latch SL may include a first inverter INV1, a second inverter INV2, and transistors 71, 72, and 73.

An output terminal of the first inverter INIV1 may be connected to an input terminal of the second inverter INV2, and an input terminal of the first inverter INV1 may be connected to an output terminal of the second inverter INV2, and thus, the first and second inverters INV1 and INV2 may operate as a latch.

The transistor 71 may be connected to the input terminal of the first inverter INV1, and the transistor 72 may be connected to the input terminal of the second inverter INV2. A set signal SETS may be applied to a gate terminal of the transistor 71, and a reset signal RST_S may be applied to a gate terminal of the transistor 72. As a level of the sensing node SO may be sensed according to a timing at which the set signal SET_S or the reset signal RST_S is activated, data may be stored in a latch.

For example, when a level of the sensing node SO is higher than a sensing trip, the eighth transistor NM8 may be turned on, and thus, when the set signal SET_S transitions to a high level, '0' may be stored in the input terminal of the first inverter INV1. In contrast, when a level of the sensing node SO is lower than the sensing trip, the eighth transistor NM8 may be turned off, and thus, when the set signal SET_S transitions to a high level, existing data may be maintained in the input terminal of the first inverter INV1.

The transistor 73 may be used to change or initialize data stored in the latch. A refresh signal REFRESH may be applied to a gate terminal of the transistor 73. When the transistor 73 is turned on by the refresh signal REFRESH and the transistor 72 is turned on by the reset signal RST_S, '1' may be stored in the input terminal of the first inverter INV1.

Figure 9:
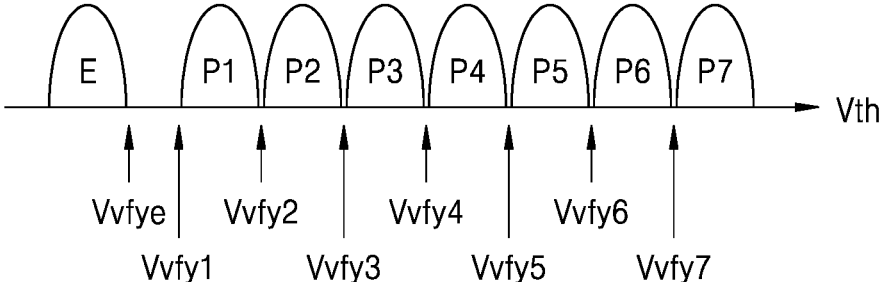
FIG. 9 is a view for describing eight program states and verification voltages.

FIG. 9 is a view for describing eight program states and verification voltages.

Referring to FIG. 9, three bits may be programmed to one memory cell, and one memory cell may be programmed to one of an erase state E and first to seventh program states P1 to P7. Although it is assumed that a memory cell is a triple level cell, an embodiment is not limited thereto.

The erase state E and the first to seventh program states P1 to P7 may be distinguished according to a threshold voltage, and the erase state E and the first to seventh program states P1 to P7 may be verified based on an erase verification voltage Vvfye and first to seventh verification voltages Vvfy1 to Vvfy7.

For example, when a target program state is the first program state P1, because a subsequent program loop is performed on a memory cell having a threshold voltage lower than the first verification voltage Vvfy1, a threshold voltage of the memory cell may become higher than the first verification voltage Vvfy1. A subsequent program loop may not be performed on a memory cell having a threshold voltage higher than the first verification voltage Vvfy1.

During an erase operation, an erase loop may be performed on a memory cell having a threshold voltage higher than the erase verification voltage Vvfye, and an erase loop may not be performed on a memory cell having a threshold voltage lower than the erase verification voltage Vvfye.

Because a verification operation is performed based on the erase verification voltage Vvfye and the first to seventh verification voltages Vvfy1 to Vvfy7, the erase state E and the first to seven program states P1 to P7 may be formed.

Figure 10:
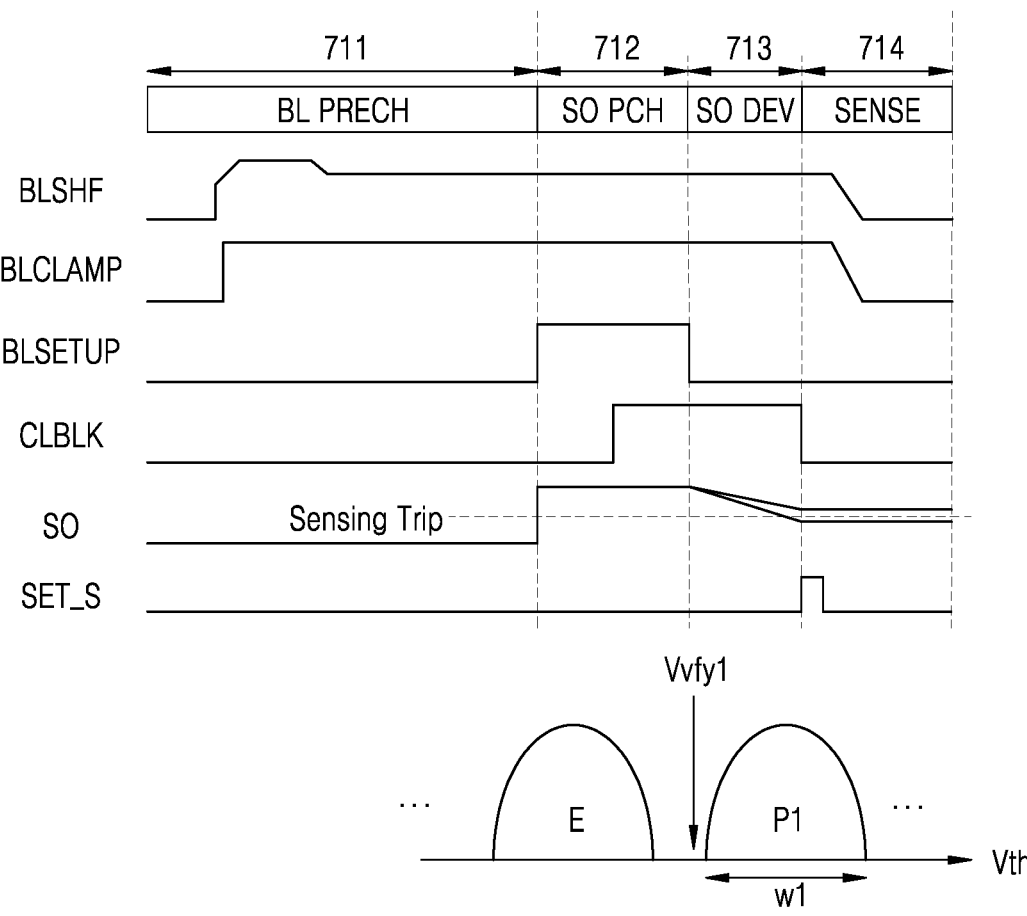
FIG. 10 is a timing diagram for describing a verification operation, according to an embodiment.

FIG. 10 is a timing diagram for describing a verification operation, according to an embodiment.

FIG. 10 will be described with reference to FIGS. 7 and 8 together. Memory cells in the erase state E may gradually become the first program state P1 as a program loop is repeatedly performed. A program loop may comprise a program operation that applies a program voltage to a selected word line to program selected memory cells of that selected word line to a corresponding program state, followed by a verification operation. The verification operation may determine if memory cells targeted for programming to a corresponding program state have been programmed to that targeted program state. Memory cells that have not reached the corresponding targeted program state may remain selected for being subject to a subsequent program loop, while those memory cells that are determined to have been programmed to the corresponding targeted program state may be deselected and avoid being subject to a programming operation (e.g., subject to a program voltage) during subsequent program loops. The program loops may be repeatedly performed until all memory cells selected for programming (e.g., those memory cells connected to a selected word line that have been selected for programming by the page buffer PB connected to the bit line BL of the memory cell) have been verified to have reached their corresponding targeted program state (or alternatively, until a predetermined number of program loops have been performed and not al selected memory cells have been verified, in which case it may be determined that a programming error has occurred).

Referring to FIG. 10, a verification operation may include a bit line precharge period 711 in which an operation of precharging a voltage of the bit line BL to a precharge level is performed, a sensing node precharge period 712 in which an operation of precharging a voltage of the sensing node SO to a precharge level is performed, a developing period 713 in which an operation of developing a voltage of the sensing node SO by electrically connecting the bit line BL to the sensing node SO is performed, and a sensing period 714 in which an operation of sensing a voltage of the sensing node SO is performed.

In the bit line precharge period 711, a bit line may be precharged based on the bit line shut-off signal BLSHF and the bit line clamping control signal BLCLAMP.

In the sensing node precharge period 712, the sensing node SO may be precharged based on the bit line setup signal BLSETUP.

In the developing period 713, a voltage level of the sensing node SO may be lowered based on the bit line setup signal BLSETUP and the bit line connection control signal CLBLK. In detail, as cell current flows from the sensing node SO to the bit line BL, a voltage level of the sensing node SO may be lowered. A plurality of memory cells connected to a selected word line may be respectively connected to a plurality of page buffer units through a plurality of bit lines. When a verification voltage is applied to the selected word line, cell currents flowing through the plurality of bit lines may vary according to program states of the plurality of memory cells, and a voltage drop of the sensing node may vary according to page buffer units. For example, memory cells (e.g., memory cell transistors) that have reached their corresponding program state may not be turned on or only slightly turned on by the verification voltage applied to the selected word line, and thus, cell current flowing through the bit line may be blocked (e.g., fully or partly) from draining by that memory cell and the voltage of the sensing node SO may be only slightly reduced. In contrast, memory cells that have not reached their corresponding program state may be turned on (fully or relatively more turned on) by the verification voltage applied to the selected word line and cell current flowing through the bit line may be drained (e.g., to ground or a low reference voltage), reducing the voltage of the sensing node SO to below the sensing trip voltage.

In the sensing period 714, as data obtained by comparison between the voltage levels of a corresponding sensing node and a sensing trip is stored in each of sensing latches included in the plurality of page buffer units, the plurality of memory cells connected to the word line to which the verification voltage is applied (the selected word line) may be divided into on-cells and off-cells. For example, as the set signal SET_S is applied to each of the sensing latches included in the plurality of page buffer units, it may be determined whether a plurality of memory cells connected to a word line to which the first verification voltage Vvfy1 is applied are programmed to the first program state P1. It will be appreciated that verifying programing to a targeted program state verifies the memory cell is programmed at least to the targeted state (e.g., to obtain a threshold voltage higher than the verification voltage). For memory cells selected for programming to the first program state P1, subsequent program loops are repetitively performed on any memory cell that did not reach the first program state P1 until it reaches the first program state P1. Thus, a distribution of the first program state P1 may be formed. A width of the distribution of the first program state P1 may be w1.

Figure 11:
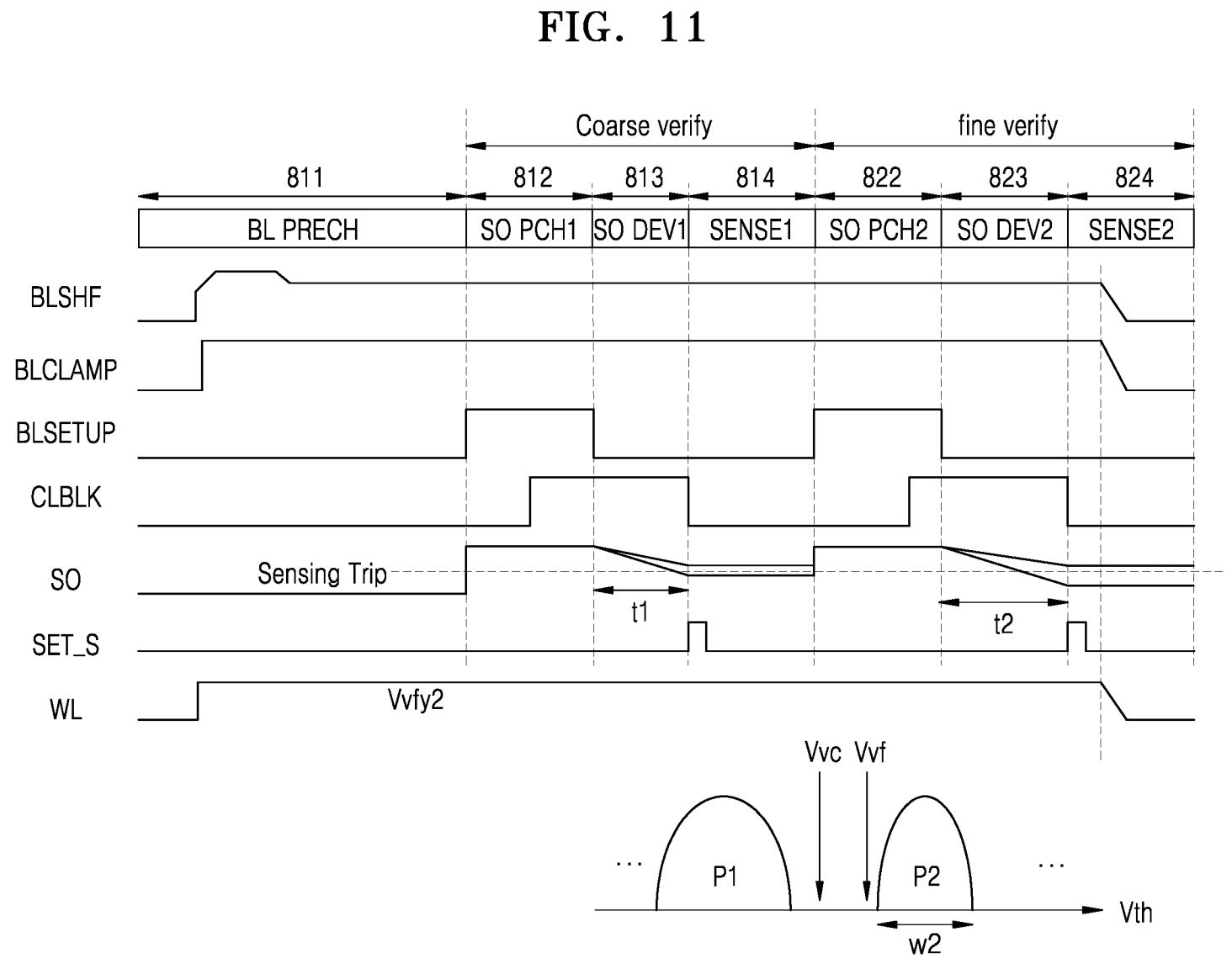

FIG. 11 is a timing diagram for describing a verification operation, according to an embodiment.

FIG. 11 will be described with reference to FIGS. 7 and 8 together.

Unlike in FIG. 10, in FIG. 11, coarse verification and fine verification may be performed during a verification operation. The coarse verification may be performed during a first sensing node precharge period 812, a first developing period 813, and a first sensing period 814, and the fine verification may be performed during a second sensing node precharge period 822, a second developing period 823, and a second sensing period 824.

The coarse verification may verify whether a threshold voltage of a selected memory cell is greater than an effective verification level Vvc. The fine verification may verify whether the threshold voltage of the selected memory cell is greater than an effective verification level Vvf.

If the threshold voltage of the selected memory cell increases above the effective verification level Vvf in a program execute period of a current program loop, the page buffer circuit 240 may apply the program inhibit voltage to the bit lie BL during the program execute period of a next program loop. Accordingly, the selected memory cell may not be programmed in the next program loop.

Referring to FIG. 7, an area between the effective verification level Vvc and the effective verification level Vvf may be referred to the forcing area. If the threshold voltage of the selected memory cell increases between the effective verification level Vvc and the effective verification level Vvf in the program execute period of the current program loop, the force data may be set '1' and the selected memory cell may be referred to a fast memory cell. The page buffer circuit 240 may apply the program bit line voltage between 0V and the program inhibit voltage to the bit line BL during the program execute period of the next program loop.

If the threshold voltage of the selected memory cell increases below the effective verification level Vvc in the program execute period of the current program loop, the force data may be '0' and the selected memory cell may be referred to a slow memory cell. The buffer circuit 240 may apply the program bit line voltage of which level is 0V to the bit line BL during the program execute period of the next program loop.

The program bit line voltage may be transferred to a channel of the selected memory cell, and the selected memory cell may be programmed due to a level difference between a program voltage of a selected word line and a channel voltage. Accordingly, as the program bit line voltage increases, an increased amount of a threshold voltage of the selected memory cell is small. That is, by using the force data, the program bit line voltage may be controlled and a relatively narrow program threshold voltage distribution may be formed. Because a level of the program bit line voltage of the slow memory cell and the fast memory cell are different during the next program loop, a final distribution width of the second program state P2 may be w2, and w2 may be less than w1 of FIG. 10.

The description of the developing period 713 of FIG. 10 may be applied to the first and second developing periods 813 and 823, and the description of the sensing period 714 of FIG. 10 may be applied to the first and second sensing periods 814 and 824.

A voltage applied to a word line during the verification operation may be the second verification voltage Vvfy2. That is, in the coarse verification and the fine verification, a verification voltage generated by the voltage generator 220 and/or applied to the selected word line may be maintained at the second verification voltage Vvfy2.

The first developing period 813 may last for a first time t1, and the second developing period 823 may last for a second time t2. The first time t1 may be shorter than the second time t2. As a developing period is shorter in the second developing period, only memory cells having a relatively larger cell current, that is, memory cells having a relatively lower threshold voltage (that may be turned on more by the verification voltage), may be determined to be an on-cell. In this example, memory cells having a threshold voltage greater than Vvc may have relatively lower cell current insufficient to allow the charge provided to the sense node during the precharge period to drain such that the sense node SO voltage is reduced below the sensing trip voltage (and these memory cells are determined to have been programmed to the Vvc during the coarse verification period in a shorter time of t1). Accordingly, an effective verification level of a coarse verification period may be Vvc, and an effective verification level of a fine verification period may be Vvf.

In some embodiments, a program operation may be performed, by using a relatively high program voltage in the immediately subsequent program loop, on a memory cell (i.e., a slow memory cell) determined to be an on-cell in the coarse verification period. A program operation may be performed, by using a relatively low program voltage in the immediately subsequent program loop, on a memory cell (i.e., a fast memory cell) determined to be an off-cell in the coarse verification period. A program operation may be performed, in the immediately subsequent program loop, on a memory cell determined to be an on-cell in the fine verification period. A program operation may not be performed, in the immediately subsequent program loop, on a memory cell determined to be an off-cell in the fine verification period. Because program voltages of a slow memory cell and a fast memory cell are different through the coarse verification period, a final distribution width of the second program state P2 may be w2, and w2 may be less than w1 of FIG. 10.

Figure 12:
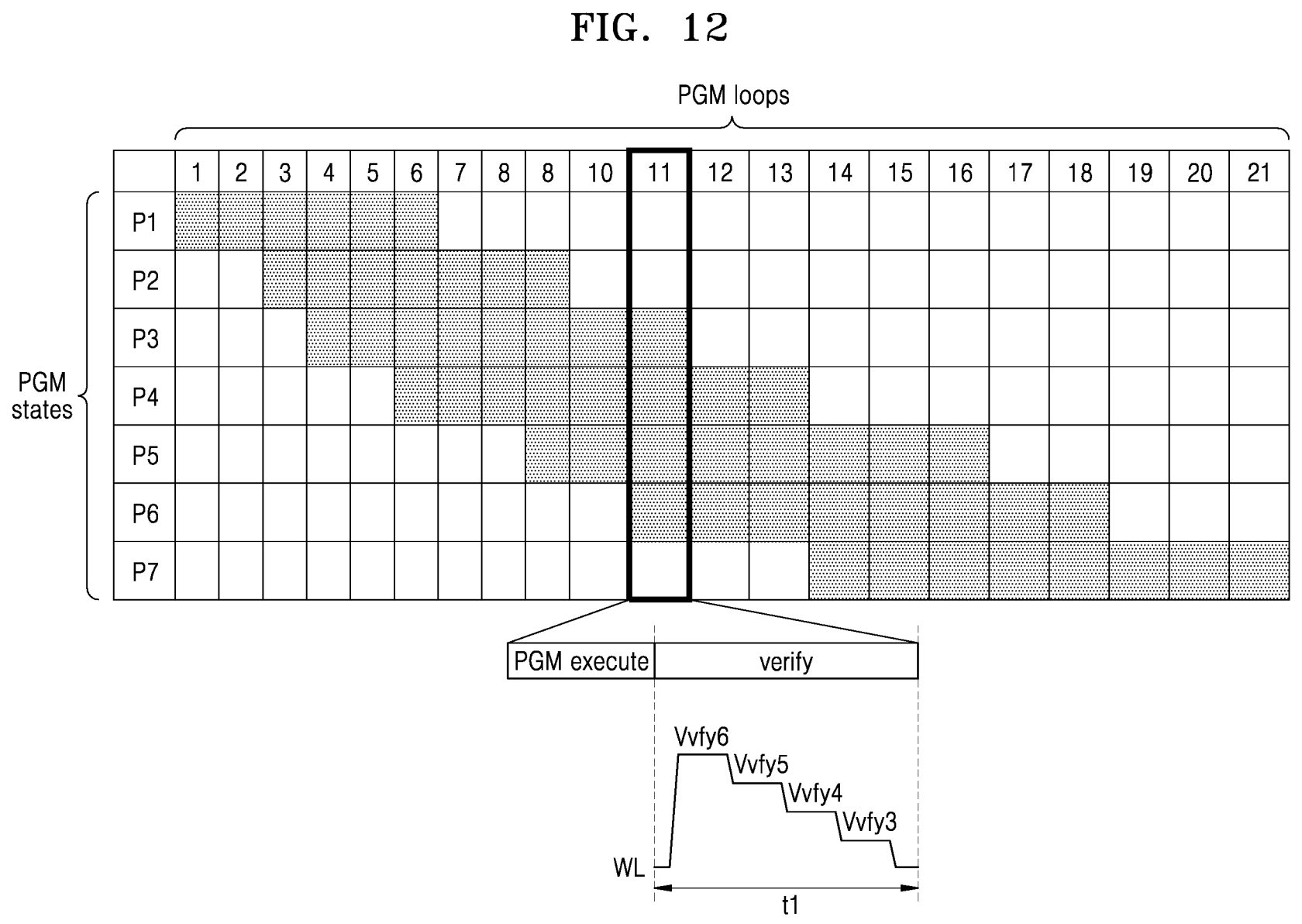

FIG. 12 is a diagram for describing a program loop, according to an embodiment.

FIG. 12 will be described with reference to FIGS. 7, 8, and 9. Referring to FIGS. 9 and 12, during a program operation, the first to seventh program states P1 to P7 may be formed by programming memory cells of a selected word line to one of the first to seventh program states P1 to P7 (while some of the memory cells of the selected word line may not be programmed and remain in the erase state E).

The program operation may include 21 program loops (PGM loops), and each program loop may include a program execution (PGM execution) period and a verification period. A program voltage may be applied to a selected word line in the PGM execution period, and a word line verification voltage may be applied to the selected word line in the verification period. The number of program loops is not limited to 21 program loops.

A gray portion in FIG. 12 may indicate a program state verified in each program loop. For example, in the $11^{th}$ program loop, the third to sixth program states P3 to P6 may be verified.

Accordingly, the third to sixth verification voltages Vvfy3 to Vvfy6 may be applied to the word line, and whenever each verification voltage is applied to the selected word line, the page buffer PB may perform a verification operation of FIG. 10 or 11. In the $11^{th}$ program loop, four verification voltages may be applied to the selected word line, and the verification operation may be performed for the first time t1. Referring to FIG. 12, in all of the program loops, a total of 53 verification voltages may be applied to the word line to verify the first to seventh program states P1 to P7.

Although the verification voltages are applied in the order of the sixth verification voltage Vvfy6, the fifth verification voltage Vvfy5, the fourth verification voltage Vvfy4, and the third verification voltage Vvfy3 in FIG. 12, the order in which the verification voltages are applied is not limited thereto.

Figure 13:
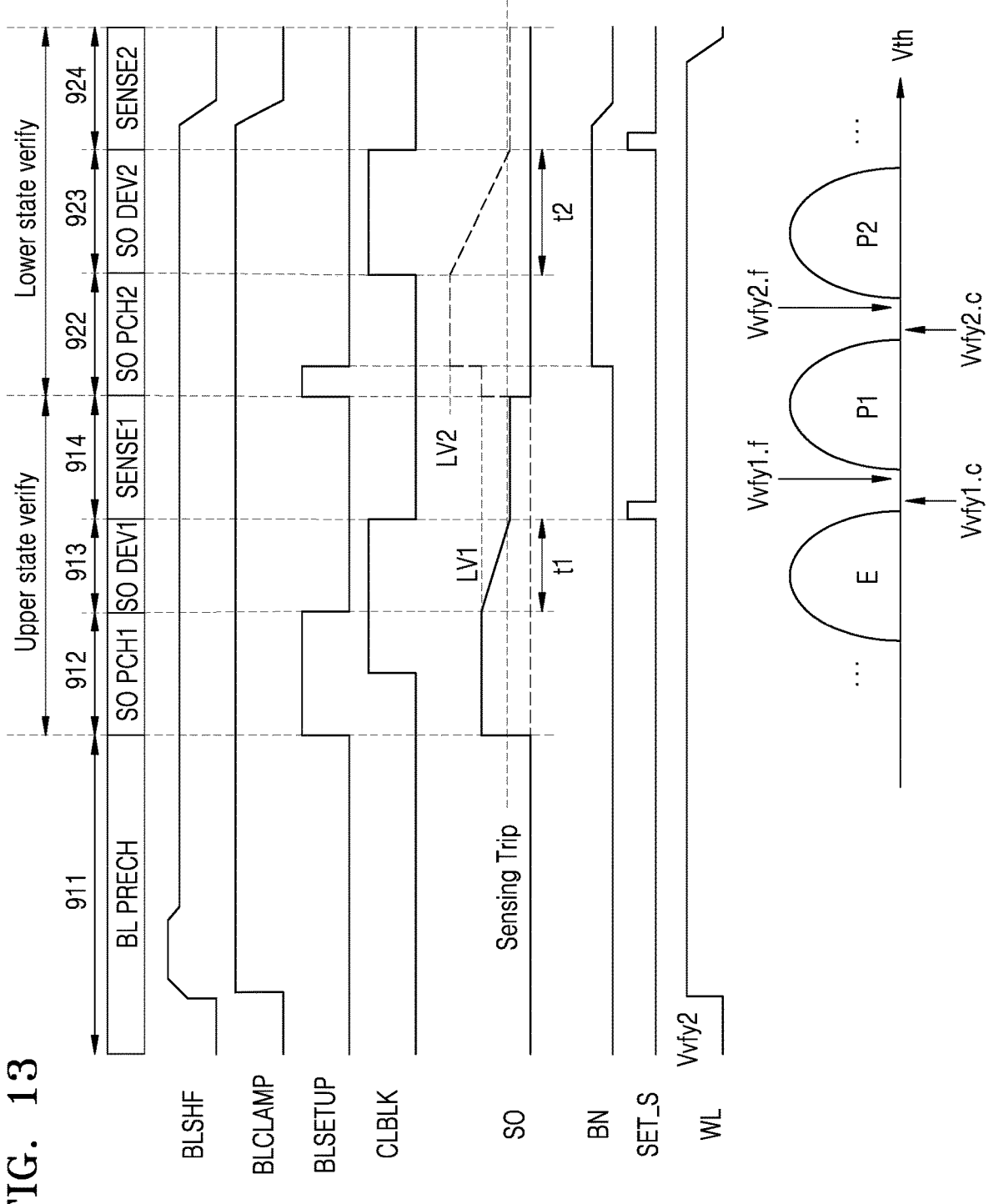
FIG. 13 is a timing diagram for describing a verification operation, according to an embodiment.

FIG. 13 is a timing diagram for describing a verification operation, according to an embodiment. FIG. 13 will be described with reference to FIGS. 2, 7, and 8.

Referring to FIG. 13, while a verification voltage applied to the selected word line is maintained constant at the second verification voltage Vvfy2, the page buffer circuit 240 may verify a higher program state (e.g., the second program state P2) and may verify a lower program state (e.g., the first program state P1).

Higher program state verification may be performed during a first sensing node precharge period 912, a first developing period 913, and a first sensing period 914. Lower program state verification may be performed during a second sensing node precharge period 922, a second developing period 923, and a second sensing period 924. In FIG. 13, the voltage of the sensing node SO is represented as a solid line during the lower program state verification for memory cells that have been verified as programmed to the higher program state during the higher program state verification (these memory cells need not be subject to additional verification during the lower program state verification). For memory cells that were not verified as programmed to the higher program state during the higher program state verification, the voltage of the sensing node SO is represented as the longer dashed line during the lower program state verification. Similar alternative representations with respect to the sensing node SO voltage level are made in the timing diagrams of the other figures of this application. It should also be appreciated that the rate of decrease of the voltage level of the sensing node SO during the development periods will vary (depending on the programming state of the memory cell being verified) from that shown in these timing diagrams (e.g., as represented in FIGS. 10 and 11) to account for different on/off states of the memory cells during the program state verification operation.

The first sensing node precharge period 912, the first developing period 913, and the first sensing period 914 may be the same as the sensing node precharge period 712, the developing period 713, and the sensing period 714 of FIG. 10.

In the second sensing node precharge period 922, the sensing node SO first be precharged to the precharge voltage provided by the precharge circuit PC, and then may be boosted to a voltage higher than the precharge voltage. In detail, the sensing node SO may be precharged to a first level Lv1 based on the bit line setup signal BLSETUP turning on transistor PM' to connect the sensing node NO to the precharge circuit PC. When a voltage of the boost node BN is increased during the second sensing node precharge period 922, a voltage of the sensing node SO may be boosted to a second level Lv2.

In the second developing period 923, the sensing node SO may be developed by the bit line connection control signal CLBLK connecting the sensing node SO to the bit line (and the selected memory cell connected to the bit line).

In the second sensing period 924, a voltage level of the sensing node SO may be compared with a sensing trip, to determine whether a memory cell is an on-cell or an off-cell. For example, the sensing node SO may be connected to the gate of transistor NM8 as described with respect to FIG. 8.

According to an embodiment, because the sensing node SO is boosted to the second level Lv2, in order to determine a memory cell to an on-cell in the second sensing period 924, a voltage level of the sensing node SO in the second developing period 23 needs to drop rapidly. That is, compared to the higher program state verification, only memory cells having a relatively lower threshold voltage may be determined to be on-cells (here, only memory cells having threshold voltages less than Vvfy1) with the remaining other memory cells subject to the lower program state verification (i.e., not including those already verified to the higher program state (e.g., P2)) being determined to have been programmed to the lower program state (e.g., P1). Accordingly, during the lower program state verification, even when a verification voltage applied to the selected word line is the second verification voltage Vvfy2, an effective verification level may be the same as a level of the first verification voltage Vvfy1. Accordingly, with the same verification voltage applied to the selected word line, memory cells may be verified to have reached multiple targeted program states (e.g., targeted program state P2 and targeted program state P1).

The first developing period 913 may last for the first time t1, and the second developing period 923 may last for the second time t2. An effective verification level during the higher program state verification may be determined according to the first level Lv1 and the first time t1, and an effective verification level during the lower program state verification may be determined according to the second level Lv2 and the second time t2. Accordingly, the first time t1 and the second time t2 may be differently controlled according to a target effective verification level. For example, the memory device 200 may control an effective verification level to be lower than a level of the second verification voltage Vvfy2 by controlling the second time t2 to be short. The memory device 200 may control an effective verification level to exceed the second verification level Vvft2 by controlling the second time t2 to be long.

According to an embodiment, because a plurality of program states may be verified while a verification voltage applied to a word line is maintained constant, the memory device 200 may provide an improved verification speed.

Figure 14:
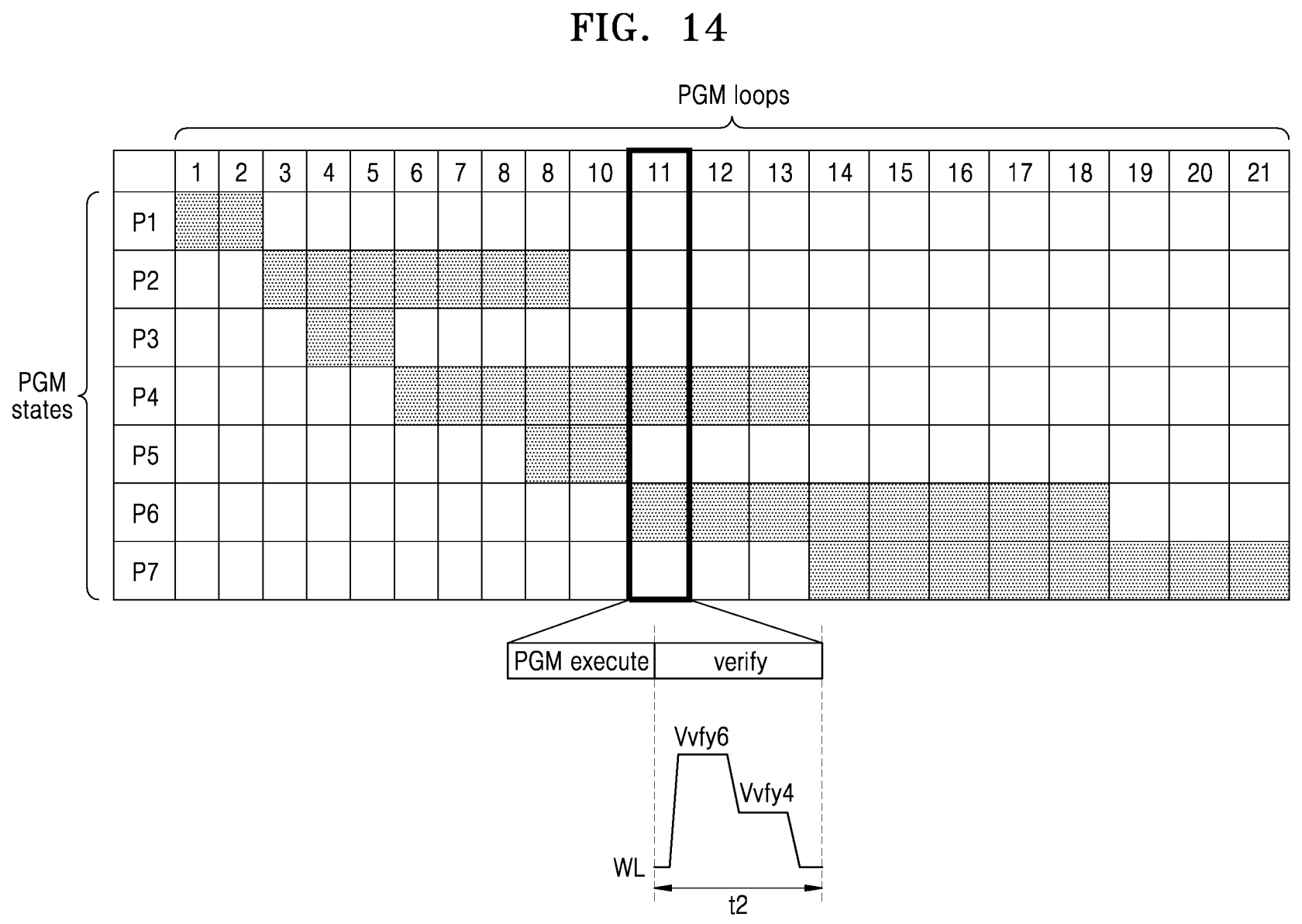

FIG. 14 is a diagram for describing a program loop, according to an embodiment. FIG. 14 will be described with reference to FIG. 13.

Unlike in FIG. 12, in FIG. 14, a plurality of program states may be verified while a constant verification voltage is applied to a word line.

For example, although the third to sixth program states P3 to P6 are verified by applying the third to sixth verification voltages Vvfy3 to Vvfy6 in the 11$^{th}$ program loop in FIG. 12, the third to sixth program states P3 to P6 may be verified by applying the fourth verification voltage Vvfy4 and the sixth verification voltage Vvfy6 in the 11$^{th}$ program loop in FIG. 14.

In detail, while the fourth verification voltage Vvfy4 is applied to the word line, the fourth program state P4 may be verified without boosting the sensing node SO, and the third program state P3 may be verified based on the boosting of the sensing node SO. While the sixth verification voltage Vvfy6 is applied to the word line, the sixth program state P6 may be verified without boosting the sensing node SO, and the fifth program state P5 may be verified based on the boosting of the sensing node SO. That is, two verification voltages may be applied in the 11$^{th}$ program loop, and the verification operation may be performed for the second time t2. The second time t2 may be shorter than the first time t1.

According to an embodiment, in at least one program loop during a program operation, at least two program states may be verified while a constant verification voltage is applied to a word line. Accordingly, unlike in FIG. 12, referring to FIG. 14, in all program loops, because a total of 37 verification voltages may be applied to the word line to verify the first to seventh program states P1 to P7, an improved verification speed may be provided.

Figure 15:
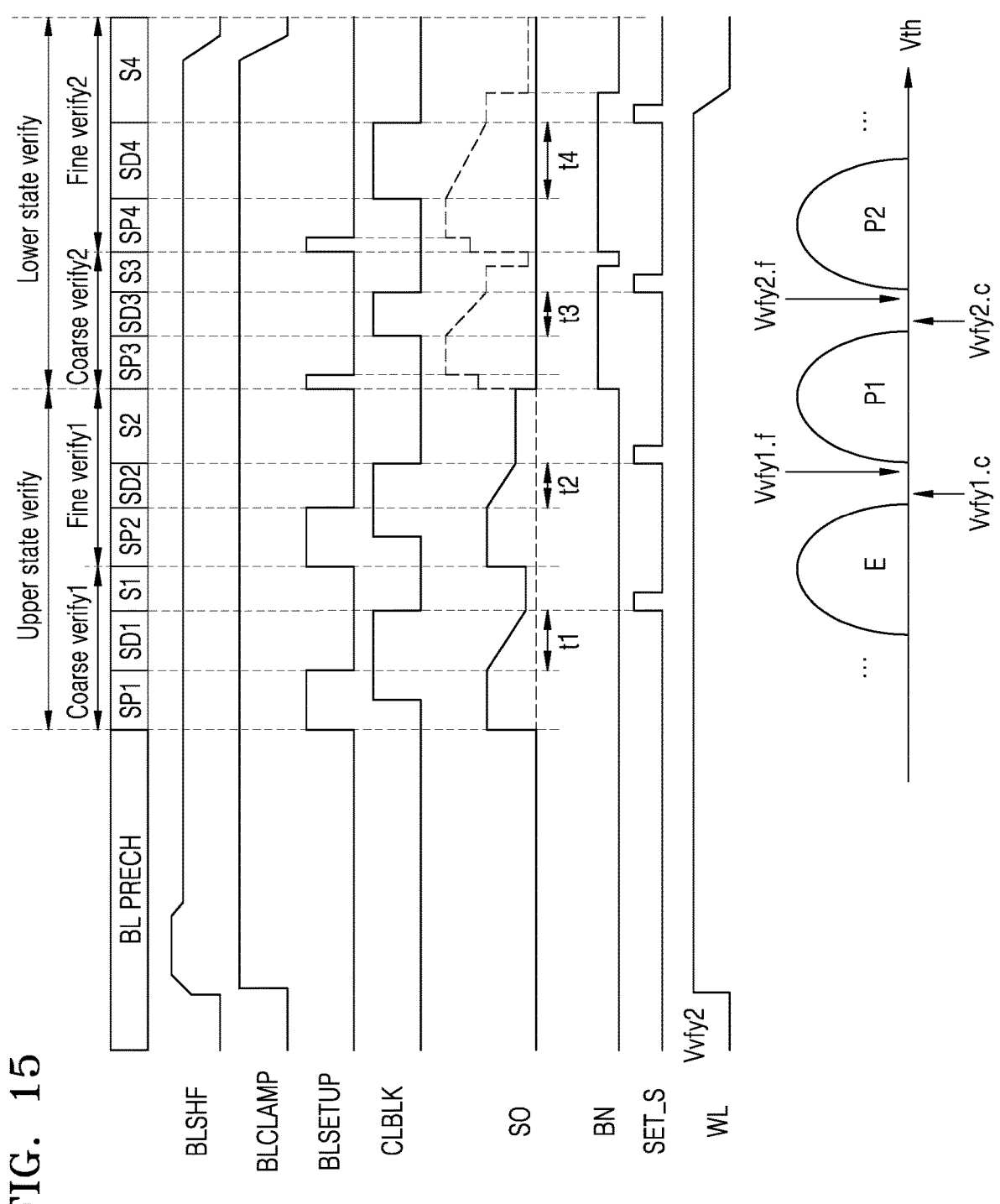
FIG. 15 is a timing diagram for describing a verification operation, according to an embodiment.

FIG. 15 is a timing diagram for describing a verification operation, according to an embodiment. In FIG. 15, the same description as that made with reference to FIGS. 12 and 14 may be omitted.

Referring to FIG. 15, first coarse verification and first fine verification may be performed during higher program state verification, and second coarse verification and second fine verification may be performed during lower program state verification.

The higher program state verification may be the same as that described herein, e.g., with respect to FIG. 11. That is, a sensing node precharge period SP1, a developing period SD1, and a sensing period S1 of the first coarse verification may be the same as the first sensing node precharge period 812, the first developing period 813, and the first sensing period 814 of FIG. 11. A sensing node precharge period SP2, a developing period SD2, and a sensing period S2 of the first fine verification may be the same as the second sensing node precharge period 822, the second developing period 823, and the second sensing period 824 of FIG. 11.

During the first coarse verification, an effective verification level may be Vvfy2.$c$, and during the first fine verification, an effective verification level may be Vvfy2.$f$. Vvfy2.$f$ may be higher than Vvfy2.$c$.

The second coarse verification may be performed during a sensing node precharge period SP3, a developing period SD3, and a sensing period S4, and the second fine verification may be performed during a sensing node precharge period SP4, a developing period SD4, and a sensing period S4.

The developing period SD3 may last for a third time t3, and the developing period SD4 may last for a fourth time t4, and the third time t3 may be shorter than the fourth time t4. As described with reference to FIG. 11, an effective verification level may be lowered by shortening a developing time. Accordingly, during the second coarse verification, an effective verification level may be Vvfy1.c, and during the second fine verification, an effective verification level may be Vvfy1.f, and Vvfy1.f may be higher than Vvfy1.c.

According to an embodiment, the sensing node SO may be boosted by increasing the voltage of the boost node BN during the second coarse verification and the second fine verification. That is, a plurality of program states may be verified by selectively boosting the sensing node SO while a constant verification voltage is applied to the word line, and coarse verification and fine verification may be performed by adjusting a length of a developing period during verification of each program state.

Figure 16A:
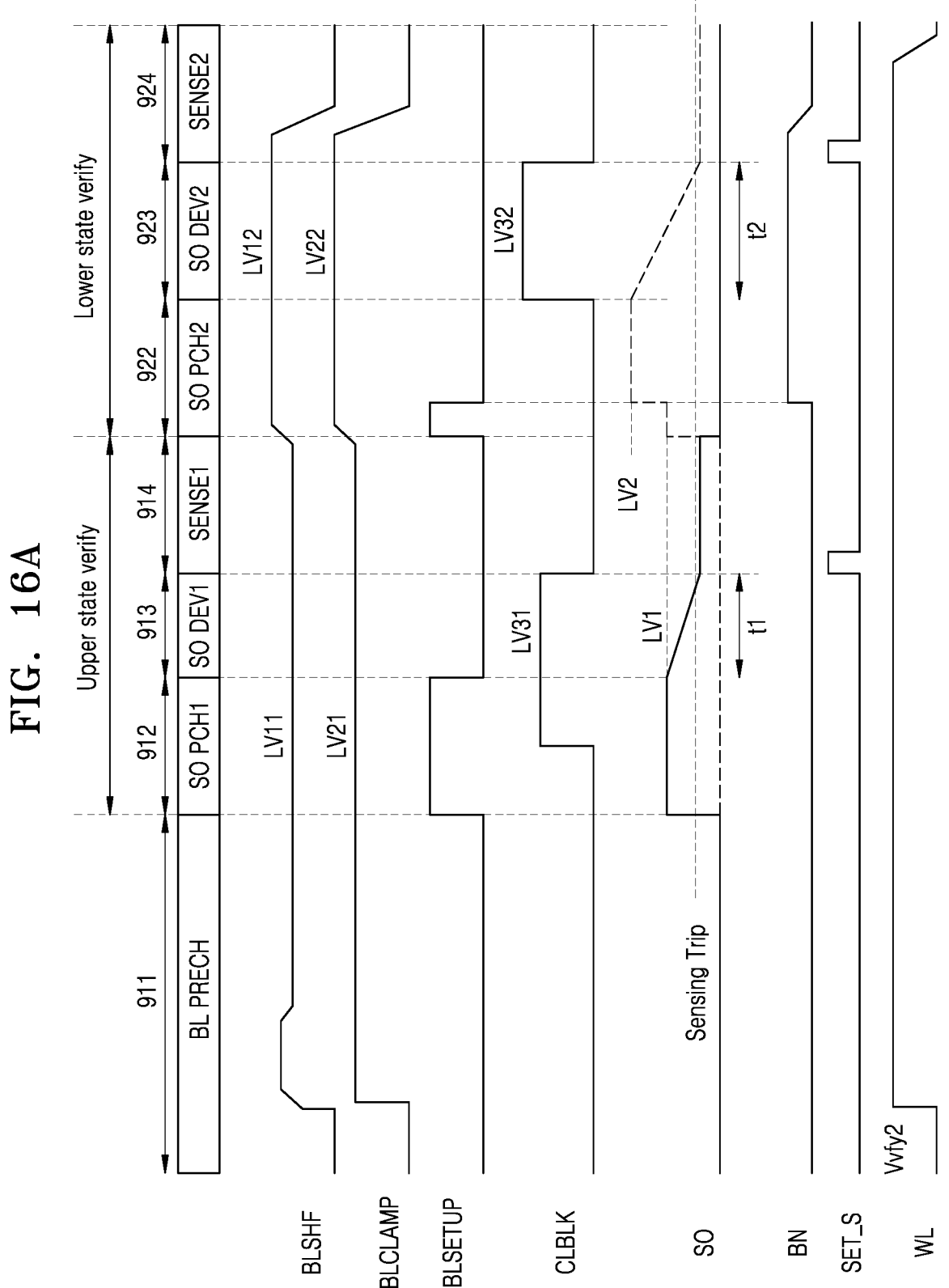
FIGS. 16A and 16B are timing diagrams for describing an embodiment of adjusting a bit line precharge level, according to an embodiment.
Figure 16B:
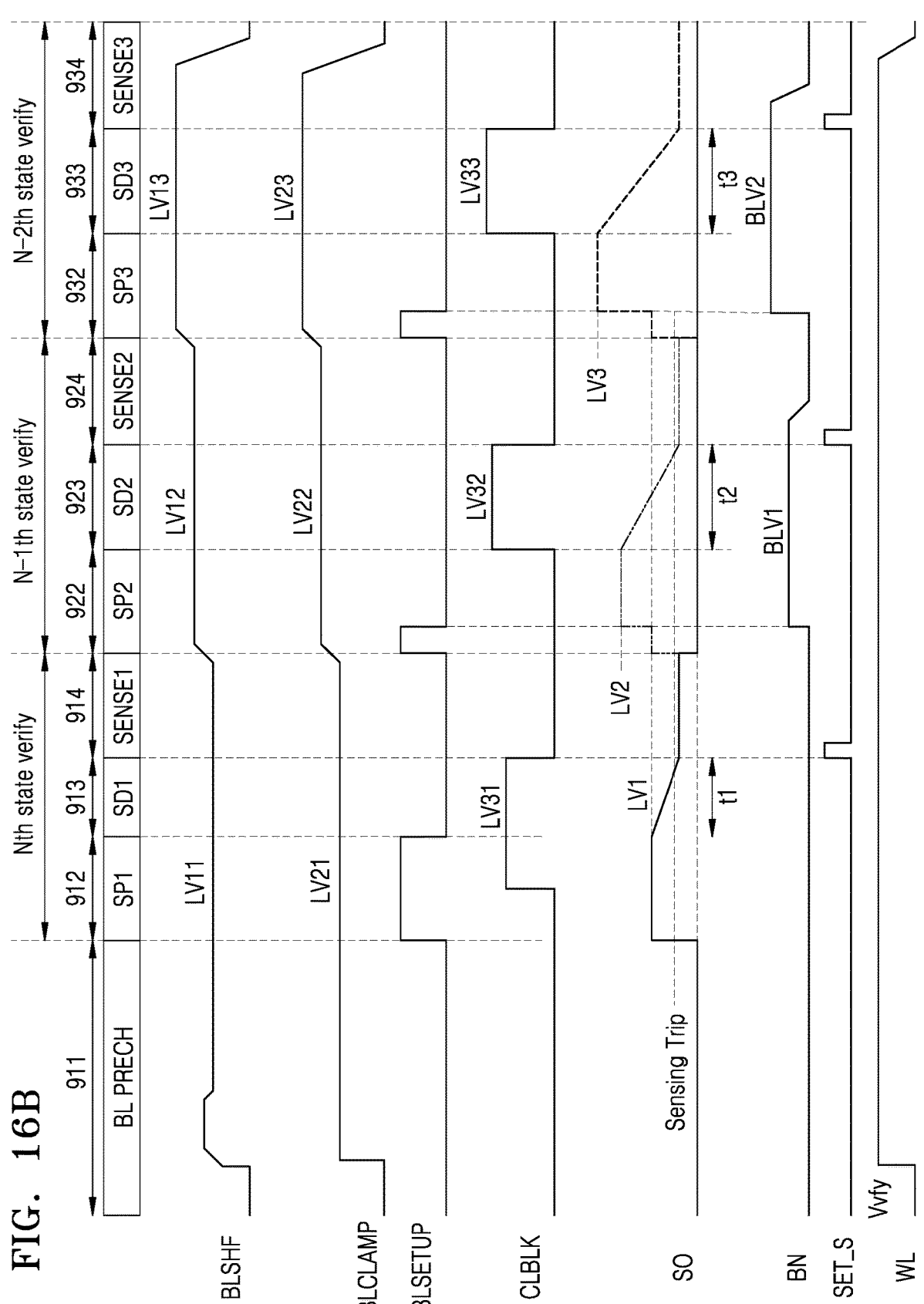
Figure 17:
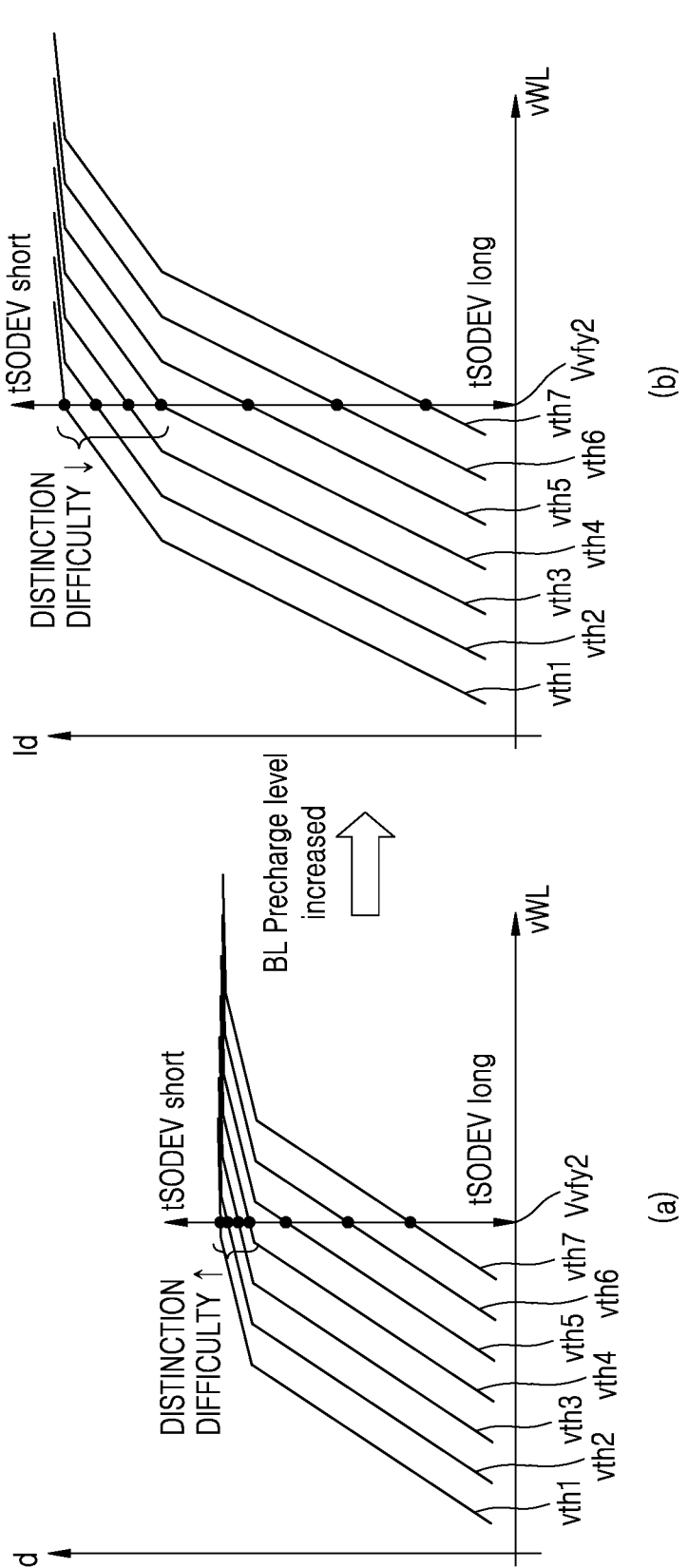
FIG. 17 is a set of diagrams for describing threshold voltage sensing when a bit line precharge level is changed.

FIGS. 16A and 16B are timing diagrams for describing an embodiment of adjusting a bit line precharge level, according to an embodiment. FIG. 17 is a set of diagrams for describing threshold voltage sensing when a bit line precharge level is changed. FIGS. 16A, 16B, and 17 will be described with reference to FIG. 7 together.

Referring to FIG. 16A, during higher program state verification, a level of the bit line shut-off signal BLSHF may increase to LV11, a level of the bit line clamping signal BLCLAMP may increase to LV21, and a level of the bit line connection control signal CLBLK may increase to LV31.

During lower program state verification, a level of the bit line shut-off signal BLSSHF may increase to LV12, a level of the bit line clamping signal BLCLAMP may increase to LV22, and a level of the bit line connection control signal CLBLK may increase to LV32. LV12 may be higher than LV11, LV22 may be higher than LV21, and LV32 may be higher than LV31.

Referring to FIG. 16B, during program verification, while a verification voltage Vvfy applied to a word line voltage WL is maintained, three program states $N^{th}$, $N-1^{th}$, and $N-2^{th}$ (N is a natural number equal to or greater than 2) may be verified. A $0^{th}$ program state may correspond to an erase state.

The $N^{th}$ program state may be verified in a first sensing node precharge period 912, a first developing period 913, and a first sensing period 914. During N, program state verification, a level of the bit line shut-off signal BLSHF may increase to LV11, a level of the bit line clamping signal BLCLAMP may increase to LV21, and a level of the bit line connection control signal CLBLK may increase to LV31.

The $N-1^{th}$ program state may be verified in a second sensing node precharge period 922, a second developing period 923, and a second sensing period 924. During $N-1^{th}$ program state verification, a level of the bit line shut-off signal BLSHF may increase to LV12, a level of the bit line clamping signal BLCLAMP may increase to LV22, and a level of the bit line connection control signal CLBLK may increase to LV32. LV12 may be higher than LV11, LV22 may be higher than LV21, and LV32 may be higher than LV31.

The $N-2^{th}$ program state may be verified in a third sensing node precharge period 932, a third developing period 933, and a third sensing period 934. During $N-2^{th}$ program state verification, a level of the bit line shut-off signal BLSHF may increase to LV13, a level of the bit line clamping signal BLCLAMP may increase to LV23, and a level of the bit line connection control signal CLBLK may increase to LV33. LV13 may be higher than LV12, LV23 may be higher than LV22, and LV33 may be higher than LV32.

Also, referring to FIG. 16B, during the $N-1^{th}$ program state verification, the sensing node SO may be precharged to a first level LV1 and then may be boosted to a second level LV2 as a voltage of a level BLV1 is applied to the boost node BN. During the $N-2^{th}$ program state verification, the sensing node SO may be precharged to the first level LV1 and then may be boosted to a third level LV3 as a voltage of a level BLV2 is applied to the boost node BN. The level BLV2 may be higher than BLV1, and the third level LV3 may be higher than the second level LV2.

A diagram (a) of FIG. 17 is a diagram for describing a word line voltage vWL and drain current Id for each threshold voltage before a bit line precharge level is increased.

A diagram (b) of FIG. 17 is a diagram for describing the word line voltage vWL and the drain current Id for each threshold voltage after the bit line precharge level is increased.

Referring to the diagram (a) of FIG. 17, during a verification operation, the second verification voltage Vvfy2 may be applied to a word line, and data of memory cells having first to seventh threshold voltages vth1 to vth7 may be sensed according to a developing time tSODEV. In detail, as the developing time tSODEV is shorter, data of a memory cell having a lower threshold voltage may be sensed, and thus, an effective verification level may be lowered. As the developing time tSODEV is longer, data of a memory cell having a higher threshold voltage may be sensed. However, according to a relationship between the word line voltage vWL and the drain current Id, as the developing time tSODEV decreases, a deviation of the drain current Id flowing through memory cells having various threshold voltages vth1 to vth7 may decrease. Accordingly, a deviation of the sensing node SO due to the drain current Id may also decrease, and it may be difficult to distinguish data stored in the memory cells having various threshold voltages.

Referring to the diagram (b) of FIG. 17, during a verification operation, the second verification voltage Vvfy2 may be applied to a word line, and data of memory cells having the first to seventh threshold voltages vth1 to vth7 may be sensed according to the developing time tSODEV. Compared to the diagram (a) of FIG. 17, because the bit line precharge level is increased, a maximum value of the drain current Id flowing through each memory cell may also increase. Accordingly, because, even when the developing time tSODEV decreases, a deviation of the drain current Id flowing through the memory cells having the first to seventh threshold voltages vth1 to vth7 relatively increases, a deviation of levels of the sensing nodes SO due to the drain current Id may also increase. Accordingly, data stored in memory cells having various threshold voltages may be relatively easily distinguished through a sensing latch.

That is, according to an embodiment, during lower program state verification, the memory device 200 may ensure an effective verification level lower than an effective verification level used during higher program state verification by increasing a bit line precharge level.

Figure 18:
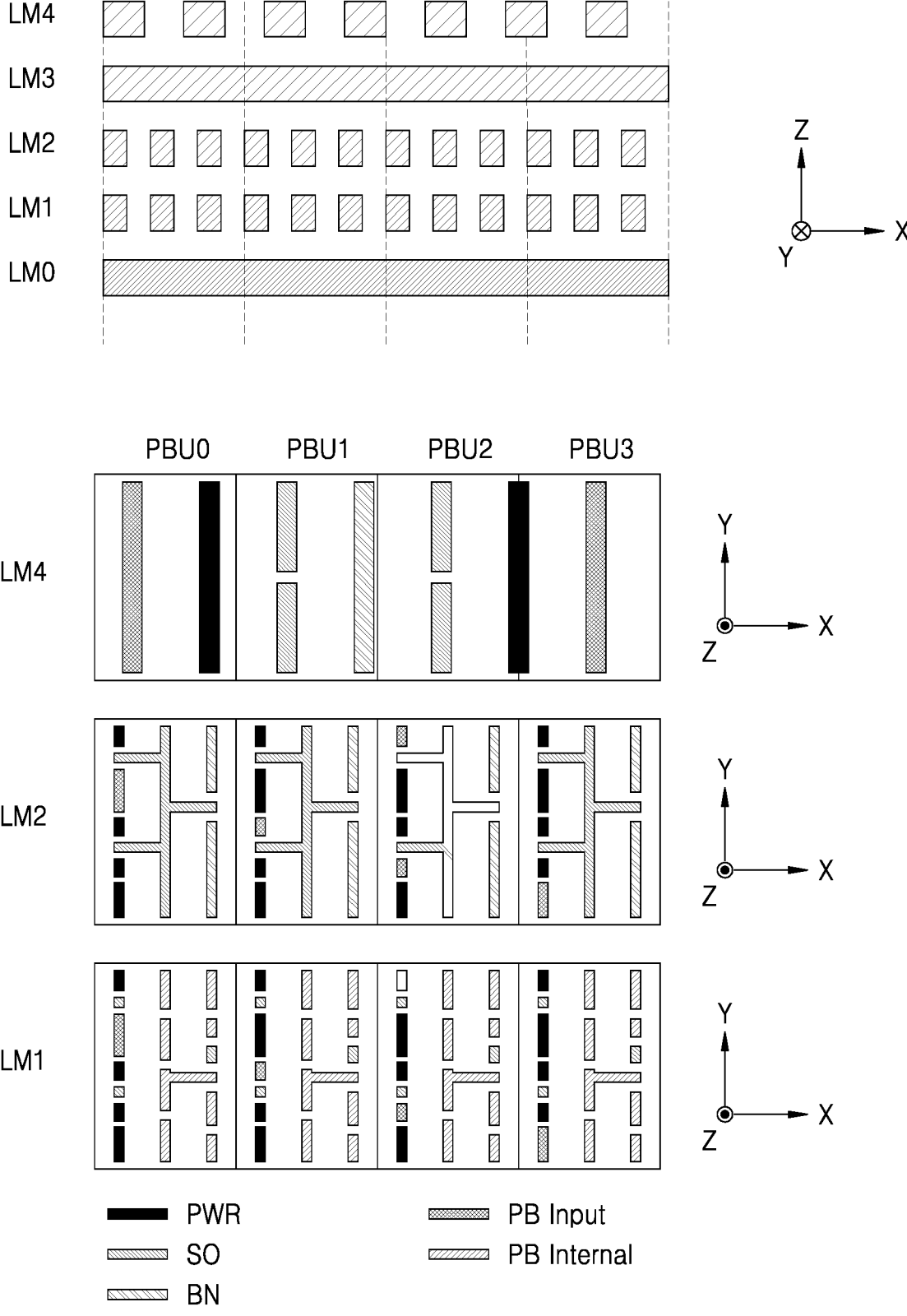
FIG. 18 is a view for describing a wiring layer of a page buffer circuit, according to an embodiment.

FIG. 18 is a view for describing a wiring layer of a page buffer circuit, according to an embodiment. FIG. 18 will be described with reference to FIGS. 6 and 7.

Referring to FIG. 18, the page buffer circuit 240 may include first to fourth page buffer units PBU0 to PBU4. The first to fourth page buffer units PBU0 to PBU4 may be formed based on wirings formed in first to fifth wiring layers LM0 to LM4 of the memory device stacked in a +Z direction. A substrate in which a plurality of transistors included in the first to fourth page buffer units PBU0 to PBU4 are formed below the first wiring layer LM0. A wiring extending in an X axis direction may be formed in the first and fourth wiring layers LM0 and LM3, and a wiring extending in a Y axis direction may be formed in the second, third, and fifth wiring layers LM1, LM2, and LM4. Although not shown in FIG. 18, wirings formed in the third wiring layer LM2 may connect wirings of the second wiring layer LM3 and wirings of the fourth wiring layer LM5 to each other. Some wirings formed on the first wiring layer LM0 may connect the plurality of transistors formed on the substrate and wirings of the third wiring layer LM1 to each other. Some wirings formed on the first wiring layer LM0 may connect the plurality of transistors formed on the substrate to each other.

Referring to FIG. 18, a first wiring PB Internal, a second wiring PWR, a third wiring PB Input, a fourth wiring SO and a fifth wiring BN may be formed on at least one of the first to fifth wiring layers LM0 to LM5. The first wiring PB Internal may be wiring that connects the plurality of transistors each other. The second wiring PWR may be wiring that provides a power to the plurality of transistors. The third wiring PB Input may be wiring that transfers signals to a gate terminal of the plurality of transistors. The fourth wiring SO may be wiring corresponding to the sensing node of the page buffer units PB0 to PBU4. The fifth wiring BN may be wiring corresponding to the boost node of the page buffer units PB0 to PBU4.

In the second wiring layer LM1, the first wiring PB Internal, the second wiring PWR, the third wiring PB Input and the fourth wiring SO may be formed.

In the third wiring layer LM2, the second wiring PWR, the third wiring PB Input, the fifth wiring BN and the fourth wiring SO may be formed.

The second wiring PWR formed in the third wiring layer LM2 may be connected to the second wiring PWR formed in the second wiring layer LM1 via a contact extending in +Z direction. The third wiring PB Input formed in the third wiring layer LM2 may be connected to the third wiring PB Input formed in the second wiring layer LM1 via a contact.

In the fifth wiring layer LM4, the second wiring PWR, the third wiring PB Input, the fourth wiring SO, and the fifth wiring BN may be formed. The second wiring PWR formed in the fifth wiring layer LM4 may be connected to the second wiring PWR formed in the third wiring layer LM2 via wirings formed in the fourth wiring layer LM3.

A power provided from external of the page buffer circuit (for example, 240 of FIG. 1) may be transferred to some transistors (for example, PM' and PM of FIG. 7) via the second wiring PWR formed in the first to fifth wiring layer LM0 to LM4.

A signal (for example, signal provided to a gate terminal of a transistor included in PBU of FIG. 7) may be transferred to the transistor via the third wiring PB Input formed in the first to fifth wiring layer LM0 to LM4.

Sensing nodes of the first to fourth page buffer units PBU0 to PBU3 may be connected each other via the fourth wiring SO formed in the first to fifth wiring layer LM0 to LM4.

The boost voltage (e.g., Vol_B of FIG. 2) may be transferred to the first to fourth page buffer units PB0 to PB3 via the fifth wiring BN formed in the second to fifth wiring layer LM1 to LM3. The boost capacitor (e.g., BC of FIG. 7) may be formed between the fourth wiring SO and the fifth wiring BN.

In the third wiring layer LM2 and the fourth wiring layer 1M4, because the fourth wiring SO and the fifth wiring BN are located adjacent to each other, a capacitance between the fourth wiring SO and the fifth wiring BN may be increased.

Figure 19:
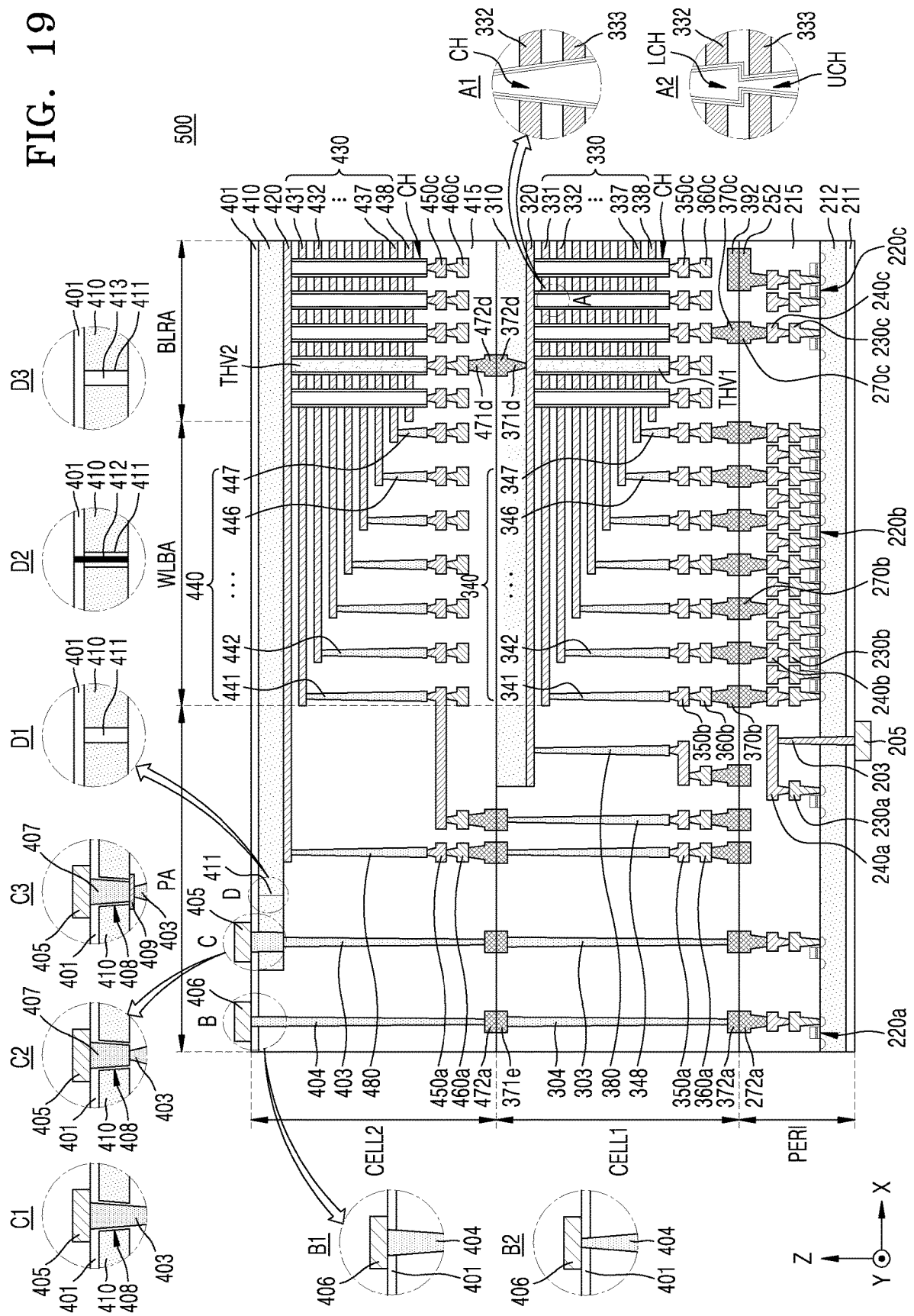
FIG. 19 is a view for describing a memory device, according to an embodiment.

FIG. 19 is a view illustrating a memory device 500 according to some embodiments. Memory device 500 is an example of memory device 200 described herein; operation and structure of the structure of memory device 200 may be implemented with the structure described with respect to memory device 500. For example, the memory cell array 210, the voltage generator 220, control logic 230 (including boost voltage controller 231), page buffer circuit 240, row decoder 250 of memory device 200, their components and operation may be implemented with memory device 500.

Referring to FIG. 19, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 19, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 19. However, the invention is not limited thereto. In certain embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 212 and a plurality of circuit elements 220a, 220b and 220c formed on the first substrate 212. An interlayer insulating layer 215 including one or more insulating layers may be provided on the plurality of circuit elements 220a, 220b and 220c, and a plurality of metal lines electrically connected to the plurality of circuit elements 220a, 220b and 220c may be provided in the interlayer insulating layer 215. For example, the plurality of metal lines may include first metal lines 230a, 230b and 230c connected to the plurality of circuit elements 220*a*, 220*b* and 220*c*, and second metal lines 240*a*, 240*b* and 240*c* formed on the first metal lines 230*a*, 230*b* and 230*c*. The plurality of metal lines may be formed of at least one of various conductive materials. For example, the first metal lines 230*a*, 230*b* and 230*c* may be formed of tungsten having a relatively high electrical resistivity, and the second metal lines 240*a*, 240*b* and 240*c* may be formed of copper having a relatively low electrical resistivity.

The first metal lines 230*a*, 230*b* and 230*c* and the second metal lines 240*a*, 240*b* and 240*c* are illustrated and described in the present embodiments. However, the invention is not limited thereto. In certain embodiments, at least one or more additional metal lines may further be formed on the second metal lines 240*a*, 240*b* and 240*c*. In this case, the second metal lines 240*a*, 240*b* and 240*c* may be formed of aluminum, and at least some of the additional metal lines formed on the second metal lines 240*a*, 240*b* and 240*c* may be formed of copper having an electrical resistivity lower than that of aluminum of the second metal lines 240*a*, 240*b* and 240*c*.

The interlayer insulating layer 215 may be disposed on the first substrate 212 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (i.e., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (i.e., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some embodiments, as illustrated in a region 'A1', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (e.g., a Y-axis direction) parallel to the top surface of the second substrate 310.

In some embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform width. The memory device 500 according to the present embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, any data stored in the dummy word line may not be read out of the memory device 500 or the dummy word line may not have memory cells connected thereto. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

The number of the lower word lines 331 and 332 penetrated by the lower channel LCH is less than the number of the upper word lines 333 to 338 penetrated by the upper channel UCH in the region 'A2'. However, the invention is not limited thereto. In certain embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 19, the first through-electrode THV1 may penetrate the common source line 320 and the plurality of word lines 330. In certain embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some embodiments, the first through-electrode THV1 and the second through-electrode THV2 may be electrically connected to each other through a first through-metal pattern 372d and a second through-metal pattern 472d. The first through-metal pattern 372d may be formed at a bottom end of the first upper chip including the first cell region CELL1, and the second through-metal pattern 472d may be formed at a top end of the second upper chip including the second cell region CELL2. The first through-electrode THV1 may be electrically connected to the first metal line 350c and the second metal line 360c. A lower via 371d may be formed between the first through-electrode THV1 and the first through-metal pattern 372d, and an upper via 471d may be formed between the second through-electrode THV2 and the second through-metal pattern 472d. The first through-metal pattern 372d and the second through-metal pattern 472d may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360c may be electrically connected to a page buffer included in the peripheral circuit region PERI. For example, some of the circuit elements 220c of the peripheral circuit region PERI may constitute the page buffer (e.g., page buffer 240 described herein), and the bit line 360c may be electrically connected to the circuit elements 220c constituting the page buffer through an upper bonding metal pattern 370c of the first cell region CELL1 and an upper bonding metal pattern 270c of the peripheral circuit region PERI.

Referring continuously to FIG. 19, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350b and second metal lines 360b may be sequentially connected onto the cell contact plugs 340 connected to the word lines 330. In the word line bonding region WLBA, the cell contact plugs 340 may be connected to the peripheral circuit region PERI through upper bonding metal patterns 370b of the first cell region CELL1 and upper bonding metal patterns 270b of the peripheral circuit region PERI.

The cell contact plugs 340 may be electrically connected to a row decoder included in the peripheral circuit region PERI. For example, some of the circuit elements 220b of the peripheral circuit region PERI may constitute the row decoder (e.g., such as row decoder 250 of FIG. 2), and the cell contact plugs 340 may be electrically connected to the circuit elements 220b constituting the row decoder through the upper bonding metal patterns 370b of the first cell region CELL1 and the upper bonding metal patterns 270b of the peripheral circuit region PERI. In some embodiments, an operating voltage of the circuit elements 220b constituting the row decoder may be different from an operating voltage of the circuit elements 220c constituting the page buffer. For example, the operating voltage of the circuit elements 220c constituting the page buffer may be greater than the operating voltage of the circuit elements 220b constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370b may be formed in the first cell region CELL1, and the upper bonding metal patterns 270b may be formed in the peripheral circuit region PERI. The upper bonding metal patterns 370b of the first cell region CELL1 and the upper bonding metal patterns 270b of the peripheral circuit region PERI may be electrically connected to each other by the bonding method. The upper bonding metal patterns 370b and the upper bonding metal patterns 270b may be formed of aluminum, copper, or tungsten.

In the external pad bonding region PA, a lower metal pattern 371e may be formed in a lower portion of the first cell region CELL1, and an upper metal pattern 472a may be formed in an upper portion of the second cell region CELL2. The lower metal pattern 371e of the first cell region CELL1 and the upper metal pattern 472a of the second cell region CELL2 may be connected to each other by the bonding method in the external pad bonding region PA. Likewise, an upper metal pattern 372a may be formed in an upper portion of the first cell region CELL1, and an upper metal pattern 272a may be formed in an upper portion of the peripheral circuit region PERI. The upper metal pattern 372a of the first cell region CELL1 and the upper metal pattern 272a of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350a and a second metal line 360a may be sequentially stacked on the common source line contact plug 380 of the first cell region CELL1, and a first metal line 450a and a second metal line 460a may be sequentially stacked on the common source line contact plug 480 of the second cell region CELL2.

Input/output pads 205, 405 and 406 may be disposed in the external pad bonding region PA. Referring to FIG. 19, a lower insulating layer 211 may cover a bottom surface of the first substrate 212, and a first input/output pad 205 may be formed on the lower insulating layer 211. The first input/output pad 205 may be connected to at least one of a plurality of the circuit elements 220a disposed in the peripheral circuit region PERI through a first input/output contact plug 203 and may be separated from the first substrate 212 by the lower insulating layer 211. In addition, a side insulating layer may be disposed between the first input/output contact plug 203 and the first substrate 212 to electrically isolate the first input/output contact plug 203 from the first substrate 212.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220a disposed in the peripheral circuit region PERI through second input/output contact plugs 403 and 303, and the third input/output pad 406 may be connected to at least one of the plurality of circuit elements 220a disposed in the peripheral circuit region PERI through third input/output contact plugs 404 and 304.

In some embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In certain embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In certain embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, the invention is not limited thereto, and in certain embodiments, the diameter of the second input/output contact plug 403 may become progressively less toward the second input/output pad 405.

In certain embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In certain embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371e or may become progressively greater toward the lower metal pattern 371e.

In some embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some embodiments, as illustrated in a region 'D1', the slit 411 may be formed to penetrate the third substrate 410. For example, the slit 411 may be used to prevent the third substrate 410 from being finely cracked when the opening 408 is formed. However, the invention is not limited thereto, and in certain embodiments, the slit 411 may be formed to have a depth ranging from about 60% to about 70% of a thickness of the third substrate 410.

In certain embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In certain embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent a voltage provided through the second input/output pad 405 from affecting a metal layer disposed on the third substrate 410 in the word line bonding region WLBA.

In certain embodiments, the first to third input/output pads 205, 405 and 406 may be selectively formed. For example, the memory device 500 may be realized to include only the first input/output pad 205 disposed on the first substrate 212, to include only the second input/output pad 405 disposed on the third substrate 410, or to include only the third input/output pad 406 disposed on the upper insulating layer 401.

In some embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

The memory cell array 210 of FIG. 2 may be disposed in the first cell region CELL1 and/or the second cell region CELL2. The peripheral circuit 201 of FIG. 2 may be disposed in the peripheral circuit region PERI.

While the inventive concept has been particularly shown and described with reference to embodiments thereof by using specific terms, the embodiments and terms have merely been used to explain the inventive concept and should not be construed as limiting the scope of the inventive concept as defined by the claims. For example, although the embodiments describe providing different voltage levels to the sensing nodes SO by boosting the sensing node, different voltage levels may be provided with differently. For example, after precharging the sensing node SO to a first level with the precharge circuit, the voltage level of the sensing node SO may be decreased to a second level lower than the first level. It is thus emphasized that the embodiments should be considered in a descriptive sense only and not for purposes of limitation.

What is claimed is:

1. A memory device comprising:
  a memory cell array comprising a plurality of memory cells respectively connected to a plurality of word lines;
  a page buffer circuit connected to the memory cell array through a plurality of bit lines, including a first bit line and a second bit line, and comprising a plurality of page buffers each connected to a corresponding one of the plurality of bit lines, each of the plurality of page buffers comprising a corresponding sensing node, the page buffers including a first page buffer connected to a first memory cell via the first bit line and a second page buffer connected to a second memory cell via the second bit line;
    the page buffer circuit configured to: precharge a first sensing node of the first page buffer connected to the first memory cell to a first level in a first precharge period during verification of a first program state of the first memory cell, and
    precharge a second sensing node of the second page buffer connected to the second memory cell to a second level in a second precharge period during verification of a second program state of the second memory cell, wherein the second level is different from the first level; and
  a row decoder configured to apply a verify voltage to a selected word line commonly connected to the first memory cell and the second memory cell during the first precharge period and the second precharge period, wherein a level of the verify voltage applied to the selected word line during the first precharge period and the second precharge period are same.

2. The memory device of claim 1,
wherein the first level is lower than the second level,
wherein the first program state corresponds to programming the first memory cell to a first threshold voltage,
wherein the second program state corresponds to programming the second memory cell to a second threshold voltage, and
wherein the first threshold voltage is higher than the second threshold voltage.

3. The memory device of claim 1,
wherein the page buffer circuit further comprises a boost node adjacent to the second sensing node,
wherein the page buffer circuit is configured to initially precharge the second sensing node in the second precharge period to the first level, and
wherein the memory device comprises a boost voltage controller configured to boost the second sensing node to the second level by a boost voltage being applied to the boost node.

4. The memory device of claim 1,
wherein the page buffer circuit is configured to connect the first sensing node to the first bit line connected to the first memory cell, for a first time after the first precharge period, and to connect the second sensing node to the second bit line for a second time after the second precharge period, and
wherein the first time and the second time are different from each other.

5. The memory device of claim 1,
wherein the page buffer circuit is configured to develop the first sensing node for a first time after the first precharge period during coarse verification of the first program state, and in a third precharge period, precharge the first sensing node to the first level and then develop the first sensing node for a second time during fine verification of the first program state, and
wherein the first time is shorter than the second time.

6. The memory device of claim 1, wherein,
wherein the page buffer circuit is configured to precharge the first bit line connected to the first memory cell to the first level during verification of the first program state, and
wherein the page buffer circuit is configured to precharge the second bit line connected to the second memory cell to the second level during verification of the second program state, and
wherein the first level is lower than the second level.

7. The memory device of claim 3,
wherein transistors respectively included in the plurality of page buffers are connected to each other by wirings formed in a plurality of wiring layers of the memory device, and
wherein a wiring corresponding to the boost node is formed in at least two of the plurality of wiring layers.

8. The memory device of claim 7, wherein, in each of the at least two of the plurality of wiring layers of the memory device, a wiring corresponding to the boost node and a wiring corresponding to the second sensing node are located adjacent to each other to be capacitively coupled to each other.

9. The memory device of claim 3, wherein the page buffers comprise a third page buffer connected to a third memory cell via a third bit line of the plurality of bit lines, wherein the page buffer circuit is configured to precharge a third sensing node of the third page buffer to a third level in a third precharge period during verification of a third program state, the third level being higher than the second level, wherein the third program state corresponds to programming the third memory cell to a third threshold voltage, wherein a level of a verify voltage applied to the selected word line during the third precharge period is same as a level of a voltage applied to the selected word line during the second precharge period.

10. The memory device of claim 9, wherein the page buffer circuit is configured to precharge the third sensing node in the third precharge period to the first level, and wherein the memory device comprises a boost voltage controller configured to boost the third sensing node then to the third level by a boost voltage being applied to the boost node.

11. A memory device comprising:

a memory cell array comprising a plurality of memory cells;

a page buffer circuit connected to the memory cell array through a plurality of bit lines and comprising a plurality of page buffers each connected to a corresponding one of the plurality of bit lines, each of the plurality of page buffers comprising a boost node, a sensing node and a precharge circuit configured to precharge the sensing node to a first level during verification of a first program state and during verification of a second program state; and a boost voltage controller configured:

to apply to boost nodes of page buffers of memory cells selected for verification of the second program state, a boost voltage during verification of the second program state to increase a voltage level of sensing nodes of the page buffers from the first level to a second level higher than the first level, and to not apply any boost voltage to boost nodes of the page buffers during verification of the first program state.

12. The memory device of claim 11, wherein the first program state corresponds to programming memory cells to a first threshold voltage, and the second program state corresponds to programming memory cells to a second threshold voltage lower than the first threshold voltage.

13. The memory device of claim 11, wherein the page buffer circuit is configured to develop the sensing nodes from the second level for a first time during a coarse verification of the second program state, and to precharge the sensing nodes to the second level and then develop the sensing nodes from the second level for a second time during a fine verification of the second program state, and wherein the first time is shorter than the second time.

14. The memory device of claim 13, further comprising a row decoder configured to apply a verification voltage to a selected word line commonly connected to memory cells being subject to verification, wherein during the coarse verification and the fine verification, a level of the verification voltage applied to the selected word line is the same, wherein the page buffer circuit is configured to select a memory cell for programming in a subsequent program loop that is determined to be an off-cell during the coarse verification, and wherein the page buffer circuit is configured to select a memory cell for programming in a subsequent program loop that is determined to be an on-cell during the fine verification.

15. The memory device of claim 11, wherein transistors respectively included in the plurality of page buffers are connected to each other through wirings formed in a plurality of wiring layers of the memory device, and wherein, in a first wiring layer from among the plurality of wiring layers, a wiring corresponding to the boost node and a wiring corresponding to the sensing node are located adjacent to each other to capacitively couple to each other.

16. The memory device of claim 11, wherein transistors respectively included in the plurality of page buffers are connected to each other by wirings formed in a plurality of wiring layers of the memory device, wherein, in a second lowest wiring layer from among the plurality of wiring layers, a wiring corresponding to the sensing node and a wiring that provides power to the transistors are located adjacent to each other so that the wiring that provides power electrically shields the wiring corresponding to the sensing node.

17. A page buffer circuit comprising a plurality of page buffers respectively corresponding to a plurality of bit lines, wherein each of the plurality of page buffers comprises:

a sensing node formed in a first wiring layer selectively connected to a precharge circuit to be precharged to a first level during a verification operation, selectively connected to a corresponding bit line to be developed in a developing period, and selectively connected to a sensing latch to provide a voltage level of the sensing node in a sensing period to be compared with a reference voltage level; and a boost node formed in the first wiring layer configured to boost a voltage level of the sensing node when a boost voltage is applied during the verification operation, wherein a wiring corresponding to the sensing node and a wiring corresponding to the boost node are located adjacent to each other in the first wiring layer and are capacitively coupled together.

18. The page buffer circuit of claim 17, wherein a wiring that provides power to transistors respectively included in the plurality of page buffers is located adjacent to and electrically shields and a wiring corresponding to the sensing node in the first wiring layer.

19. The page buffer circuit of claim 17, wherein the plurality of page buffers are configured to verify a plurality of program states of a plurality of memory cells connected to the plurality of bit lines during the same verification operation, wherein, during a verification operation of a preceding program operation during which a program voltage is applied to selected memory cells of a selected word line, verification of a first program state from among the plurality of program states of a first memory cell of the selected memory cells, the sensing node of a corresponding page buffer connected to the first memory cell via a first bit line is precharged to the first level, and wherein during the verification of the preceding program operation, verification of a second program state from among the plurality of program states of a second memory cell of the selected memory cells, the sensing node of a corresponding page buffer connected to the second memory cell via a second bit line is precharged to the first level and then is boosted to a second level by the boost voltage applied to the boost node.

20. The page buffer circuit of claim 19, wherein, during verification of the first program state, the first bit line is precharged to a third level, and during verification of the second program state, the second bit line is precharged to a fourth level, wherein the third level is lower than the fourth level.

\* \* \* \* \*